US008479389B2

(12) United States Patent
Takahashi et al.

(10) Patent No.: US 8,479,389 B2
(45) Date of Patent: *Jul. 9, 2013

(54) METHOD OF MANUFACTURING A FLEX-RIGID WIRING BOARD

(75) Inventors: Michimasa Takahashi, Ogaki (JP); Masakazu Aoyama, Ogaki (JP)

(73) Assignee: Ibiden Co., Ltd., Ogaki-shi (JP)

( * ) Notice: Subject to any disclaimer, the term of this patent is extended or adjusted under 35 U.S.C. 154(b) by 341 days.

This patent is subject to a terminal disclaimer.

(21) Appl. No.: 12/574,309

(22) Filed: Oct. 6, 2009

(65) Prior Publication Data
US 2010/0018634 A1 Jan. 28, 2010

Related U.S. Application Data

(62) Division of application No. 11/927,144, filed on Oct. 29, 2007, now Pat. No. 7,982,135.

(60) Provisional application No. 60/863,396, filed on Oct. 30, 2006.

(51) Int. Cl.
*H01K 3/10* (2006.01)
*H05K 3/46* (2006.01)

(52) U.S. Cl.
USPC ............... 29/852; 29/830; 29/831; 29/832; 29/846; 29/847; 156/150

(58) Field of Classification Search
USPC .... 29/832, 852, 830, 831, 846, 847; 156/150; 438/613, 614, 622, 624, 611, 612; 174/254, 174/255, 262, 258, 260; 257/777, 784, 786, 257/770
See application file for complete search history.

(56) References Cited

U.S. PATENT DOCUMENTS

| 3,471,348 | A | * | 10/1969 | Iles et al. ........................ 216/18 |
| 4,099,038 | A | * | 7/1978 | Purdy ........................ 200/61.08 |
| 4,687,695 | A | * | 8/1987 | Hamby ........................ 428/192 |
| 4,715,923 | A | | 12/1987 | Knoll |
| 4,715,928 | A | * | 12/1987 | Hamby ........................ 216/18 |
| 5,121,297 | A | | 6/1992 | Haas |
| 5,799,392 | A | | 9/1998 | Mishiro |
| 5,854,534 | A | * | 12/1998 | Beilin et al. ................. 257/691 |
| 6,324,067 | B1 | * | 11/2001 | Nishiyama .................... 361/761 |
| 6,350,387 | B2 | * | 2/2002 | Caron et al. ................. 430/314 |

(Continued)

FOREIGN PATENT DOCUMENTS

| CN | 1806474 A | 7/2006 |
| DE | 42 08 610 C1 | 5/1993 |

(Continued)

*Primary Examiner* — Peter DungBa Vo
*Assistant Examiner* — Kue Kaying
(74) *Attorney, Agent, or Firm* — Oblon, Spivak, McClelland, Maier & Neustadt, L.L.P.

(57) ABSTRACT

A method of manufacturing a flex-rigid wiring board including disposing a flexible board comprising a flexible substrate and a conductor pattern formed over the flexible substrate and a non-flexible substrate adjacent to each other, covering a boundary between the flexible board and the non-flexible substrate with an insulating layer comprising an inorganic material, providing a conductor pattern on the insulating layer, forming a via hole opening which passes through the insulating layer and reaches the conductor pattern of the flexible board, and plating the via hole opening to form a via connecting the conductor pattern of the flexible board and the conductor pattern on the insulating layer.

20 Claims, 32 Drawing Sheets

U.S. PATENT DOCUMENTS

| | | | |
|---|---|---|---|
| 6,384,339 B1 * | 5/2002 | Neuman | 174/254 |
| 6,555,917 B1 * | 4/2003 | Heo | 257/777 |
| 7,258,549 B2 * | 8/2007 | Asahi et al. | 439/66 |
| 7,291,795 B2 * | 11/2007 | Maharshak et al. | 200/292 |
| 7,338,290 B2 | 3/2008 | Motohashi et al. | |
| 7,415,761 B2 | 8/2008 | Hirose et al. | |
| 7,423,219 B2 * | 9/2008 | Kawaguchi et al. | 174/254 |
| 7,601,919 B2 | 10/2009 | Phan et al. | |
| 7,759,582 B2 * | 7/2010 | Takahashi et al. | 174/264 |
| 7,982,135 B2 | 7/2011 | Takahashi et al. | |
| 8,035,983 B2 | 10/2011 | Takahashi et al. | |
| 8,071,883 B2 * | 12/2011 | Takahashi et al. | 174/254 |
| 8,238,109 B2 | 8/2012 | Sagisaka | |
| 2001/0010303 A1 * | 8/2001 | Caron et al. | 216/18 |
| 2003/0164548 A1 * | 9/2003 | Lee | 257/738 |
| 2005/0217895 A1 * | 10/2005 | Maharshak et al. | 174/262 |
| 2005/0243528 A1 | 11/2005 | Murayama | |
| 2006/0169485 A1 * | 8/2006 | Kawaguchi et al. | 174/254 |
| 2006/0281343 A1 * | 12/2006 | Uchida et al. | 439/67 |
| 2007/0012475 A1 * | 1/2007 | Kawaguchi et al. | 174/255 |
| 2007/0126123 A1 * | 6/2007 | Sawachi | 257/777 |
| 2007/0281505 A1 * | 12/2007 | Kobayashi et al. | 439/69 |
| 2008/0014768 A1 | 1/2008 | Lee et al. | |
| 2008/0093118 A1 | 4/2008 | Takahashi et al. | |
| 2008/0099230 A1 | 5/2008 | Takahashi et al. | |
| 2008/0168651 A1 | 7/2008 | Bhatt et al. | |
| 2008/0289859 A1 | 11/2008 | Mikado et al. | |
| 2009/0014205 A1 * | 1/2009 | Kobayashi et al. | 174/255 |
| 2009/0229876 A1 | 9/2009 | Takahashi | |
| 2009/0255111 A1 * | 10/2009 | Takahashi et al. | 29/852 |

FOREIGN PATENT DOCUMENTS

| | | |
|---|---|---|
| EP | 1 566 993 A1 | 8/2005 |
| JP | 63-293991 | 11/1988 |
| JP | 3-246986 | 11/1991 |
| JP | 5-90756 | 4/1993 |
| JP | 5-315758 | 11/1993 |
| JP | 06-216537 | 8/1994 |
| JP | 7-94835 | 4/1995 |
| JP | 2003-152309 | 5/2003 |
| JP | 2005-311244 | 11/2005 |
| JP | 2005-322878 | 11/2005 |
| JP | 2006-73819 | 3/2006 |
| JP | 2006-100703 | 4/2006 |
| JP | 2006-100704 | 4/2006 |
| JP | 2006-128360 | 5/2006 |
| JP | 2006-140213 | 6/2006 |
| JP | 2006-196800 | 7/2006 |
| JP | 2006-294666 | 10/2006 |
| JP | 2007-273654 | 10/2007 |
| JP | 4021472 B1 | 10/2007 |
| JP | 4024846 B1 | 10/2007 |
| JP | 2008-34511 | 2/2008 |
| TW | 478306 | 3/2002 |
| WO | WO 93/11652 | 6/1993 |
| WO | WO 2004/093508 A1 | 10/2004 |
| WO | WO 2004/098252 A1 | 11/2004 |

* cited by examiner

FIG. 5F" 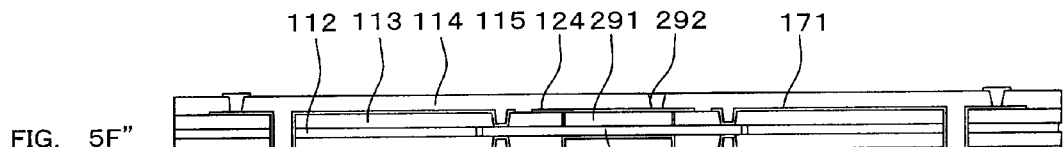
FIG. 5G" 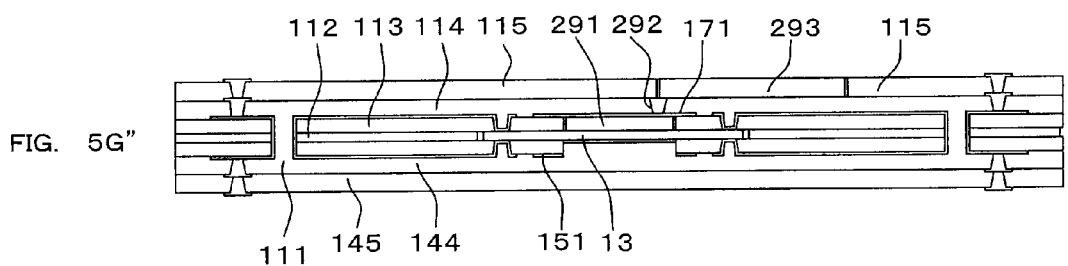
FIG. 5K" 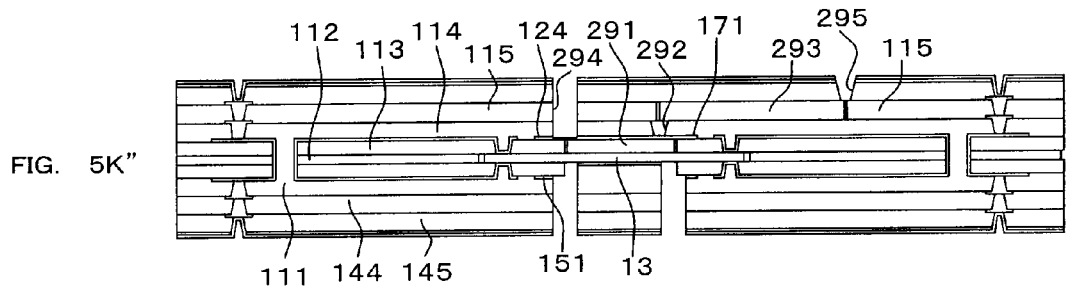
FIG. 5L" 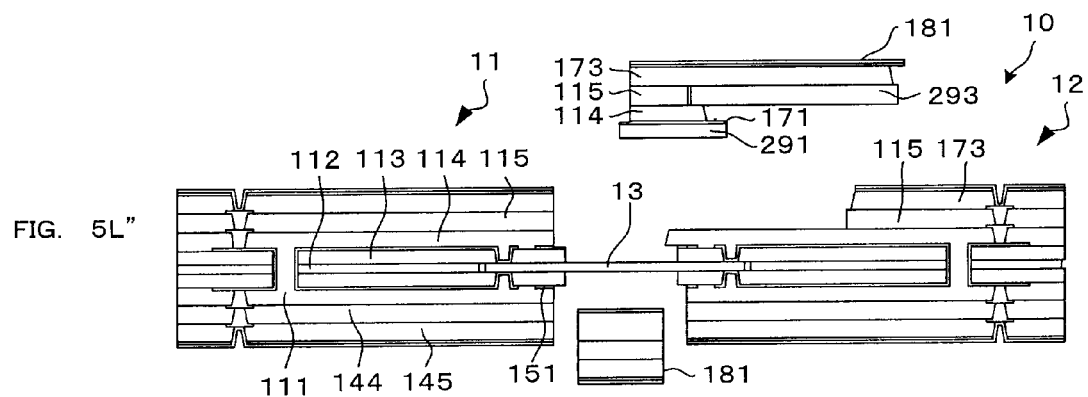

METHOD OF MANUFACTURING A FLEX-RIGID WIRING BOARD

CROSS-REFERENCE TO RELATED APPLICATIONS

The present application is a divisional of U.S. application Ser. No. 11/927,144, filed Oct. 29, 2007, which claims the benefits of priority to U.S. Application No. 60/863,396, filed Oct. 30, 2006. The contents of these applications are incorporated herein by reference in their entirety.

BACKGROUND OF THE INVENTION

1. Field of the Invention

The present invention relates to a flexible wiring board having a flexible portion and a method of manufacturing the flexible wiring board.

2. Discussion of the Background

A flex-rigid wiring board, a part of which has rigidity, and the other part of which has flexibility is described, for example, in Japanese Unexamined Patent Application Publication Nos. 2006-140213 and 2006-100703, and PCT International Publication WO2004/093508. A flex-rigid wiring board described in Japanese Unexamined Patent Application Publication No. 2006-140213 has core boards which are rigid portions, a flexible board disposed adjacent to the core boards in a horizontal direction, flexible adhesive layers laminated on the core boards and the flexible board, wiring patterns formed on the flexible adhesive layers located on the rigid portions, and blind vias and/or through-holes connecting the wiring patterns formed on individual layers. In the structure described above, the flexible adhesive layer is laminated on the flexible board.

Japanese Unexamined Patent Application Publication No. 2006-100703 describes a method for manufacturing a flex-rigid wiring board. In that method, first, rigid boards each having a vertical wiring portion in a connection region and a flexible board having connection terminals formed at end portions are separately formed. Subsequently, the connection regions of the rigid boards are each machined to form a cut-off portion having a depth larger than the thickness of the flexible board, thereby forming steps. Next, the connection terminals of the flexible board are connected to the vertical wiring portions at the steps.

A flex-rigid wiring board described in PCT International Publication WO2004/0931108 includes a rigid board and a flexible board which are bonded with an insulating adhesive interposed to form a unified body. In addition, connection electrode pads of the rigid and flexible boards are electrically and physically connected to each other through with a conductor block and penetrating through the insulating adhesive. In the flex-rigid wiring board having the above structure, the flexible board is disposed on one side of the rigid substrate, a via is formed by laser irradiation, and connection is formed by plating from the flexible board side.

The contents of the above mentioned publications are incorporated herein by reference in their entirety.

SUMMARY OF THE INVENTION

According to one aspect of the present invention, a flex-rigid wiring board has a flexible board including a flexible substrate and a conductor pattern formed over the flexible substrate, a non-flexible substrate disposed adjacent to the flexible board, an insulating layer including an inorganic material and covering the flexible board and the non-flexible substrate, a conductor pattern formed on the insulating layer, and a plating layer connecting the conductor pattern of the flexible board and the conductor pattern on the insulating layer. The insulating layer is exposing at least one portion of the flexible board.

According to another aspect of the present invention, a flex-rigid wiring board has a flexible board including a flexible substrate and a conductor pattern formed over the flexible substrate, a non-flexible substrate disposed adjacent to the flexible board, an insulating layer including an inorganic material and covering the flexible board and the non-flexible substrate, the insulating layer exposing at least one portion of the flexible board, a conductor pattern formed on the insulating layer, and a via formed in the insulating layer and connecting the conductor pattern on the insulating layer and the conductor pattern of the flexible board.

According to yet another aspect of the present invention, a flex-rigid wiring board includes a flexible board including a flexible substrate and a conductor pattern formed over the flexible substrate, a non-flexible substrate disposed adjacent to the flexible board, an insulating layer including an inorganic material and covering the flexible board and the non-flexible substrate, the insulating layer exposing one or more portions of the flexible board, a conductor pattern formed on the insulating layer, and a via formed in the insulating layer and connecting the conductor pattern on the insulating layer and the conductor pattern of the flexible board. The flexible board further includes a protective layer covering; the conductor pattern of the flexible board, and the via formed in the insulating layer includes a plating layer.

According to still another aspect of the present invention, a method of manufacturing a flex-rigid wiring board includes disposing a flexible board including a flexible substrate and a conductor pattern formed over the flexible substrate and a non-flexible substrate adjacent to each other, covering a boundary between the flexible board and the non-flexible substrate with an insulating layer including an inorganic material, providing a conductor pattern on the insulating layer, forming a via hole opening which passes through the insulating layer and reaches the conductor pattern of the flexible board, and plating the via hole opening to form a via connecting the conductor pattern of the flexible board and the conductor pattern on the insulating layer.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIGS. 5A', 5G', 5K' and 5L' are views illustrating modified steps of the method of manufacturing a flex-rigid wiring board shown in FIGS. 5A to 5L;

FIGS. 5F", 5G" 5K" and 5L" are views illustrating other modified steps of the method of manufacturing a flex-rigid wiring board shown in FIGS. 5A to 5L;

DESCRIPTION OF THE EMBODIMENTS

Figure 1A:
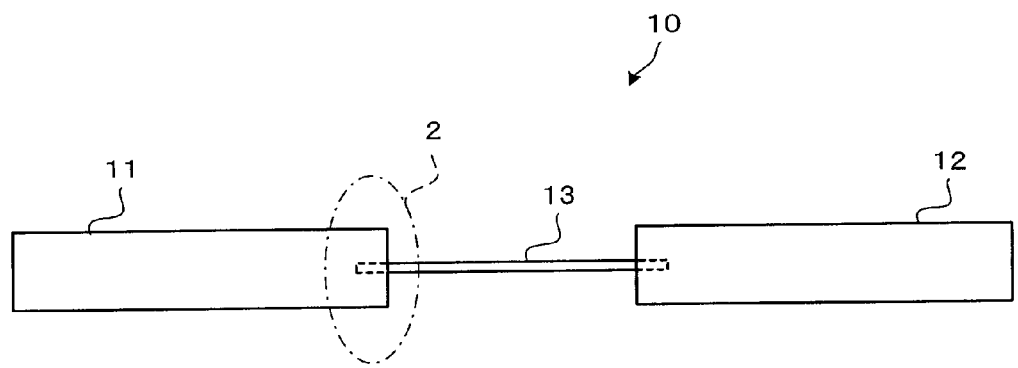
FIGS. 1A and 1B are a side view and a plan view, respectively, of a flex-rigid wiring board according to one embodiment of the present invention.

The embodiments will now be described with reference to the accompanying drawings, wherein like reference numerals designate corresponding or identical elements throughout the various drawings.

Figure 1B:
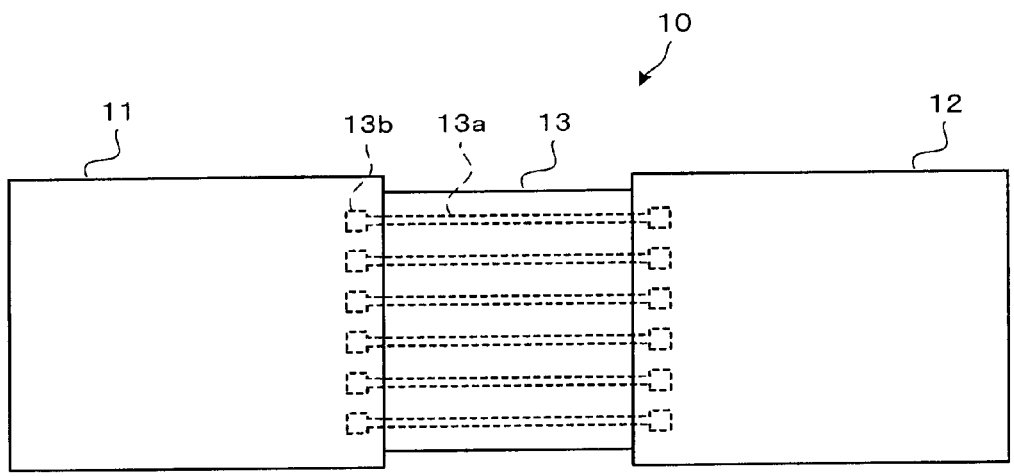

As shown in FIGS. 1A and 1B, a flex-rigid wiring board 10 according to one embodiment of the present invention has a first rigid board 11, a second rigid board 12, and a flexible board 13 connecting the rigid boards 11, 12.

On the first and the second rigid boards 11, 12, appropriate circuit patterns are formed. In addition, whenever necessary, for example, electronic elements, such as a semiconductor chip, are connected.

On the flexible board 13, a stripe wire (13a) is formed to connect the circuit patterns of the first rigid board 11 and the second rigid board 12. Hence, the wire (13a) connects the circuit pattern of the rigid board 11 and the circuit pattern of the rigid board 12.

Figure 2:
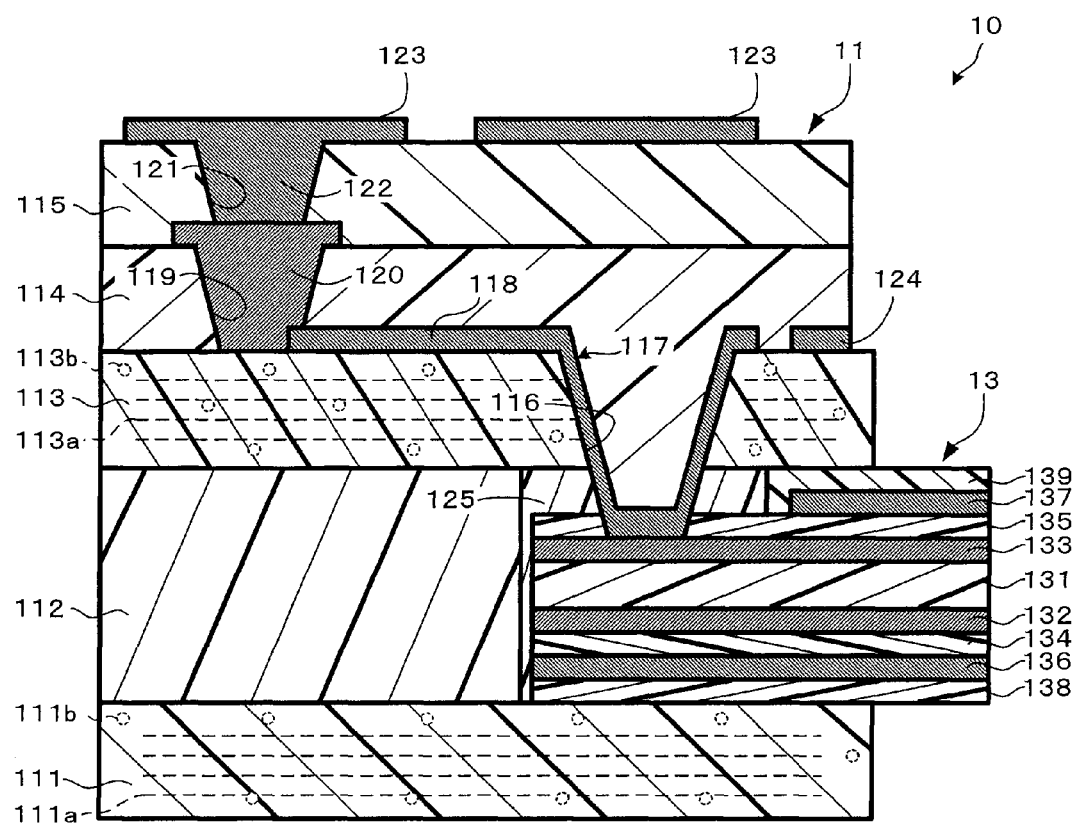
FIG. 2 is a partly enlarged view of FIG. 1A.

As for the structure of a connection portion of the flexible board 13 with the rigid boards 11, 12, the connection portion between the rigid board 11 and the flexible board 13 is describe in detail by way of example with reference to FIG. 2.

FIG. 2 is an enlarged cross-sectional view of an area represented by reference numeral 2 of FIG. 1A. As shown in the figure, the flexible board 13 has the structure in which a substrate 131, conductive layers 132, 133, insulating films 134, 135, shield layers 136, 137, and cover lays 138, 139 are laminated.

The substrate 131 may be formed of an insulating flexible sheet, such as a polyimide sheet having a thickness of approximately 20 to 50 µm, preferably a thickness of approximately 30 µm.

The conductive layers 132, 133 may be formed on the front surface and the rear surface of the substrate 131, respectively, so that the stripe wire pattern (13a) is formed. The conductive layers 132, 133 may be each formed, for example, of a copper pattern having a thickness of approximately 5 to 15 µm.

The insulating films 134, 135 may be each formed, for example, of a polyimide film having a thickness of approximately 5 to 15 µm and insulate the conductive layers 132, 133 from the outside.

The shield layers 136, 137 (also referred as "electromagnetic shield layers") may be formed of conductive layers, such as cured films made from a silver paste, to shied electromagnetic noises to the conductive layers 132, 133 from the outside and to shield electromagnetic noises to the outside from the conductive layers 132, 133.

The cover lays 138, 139 may be each formed of an insulating film made, for example, of a polyimide film having a thickness of approximately 5 to 15 µm, and insulate and protect the whole flexible board 13 from the outside.

On the other hand, the rigid board 11 is formed of a first insulating layer 111, a non-flexible substrate 112, a second insulating layer 113, a first upper insulating layer 114, and a second upper insulating layer 115, which are laminated to each other.

The non-flexible substrate 112 imparts rigidity to the rigid board 11 and may be formed of a non-flexible insulating material such as a glass epoxy resin. The non-flexible substrate 112 is disposed apart from the flexible board 13 in a horizontal direction. The non-flexible substrate 112 is formed to have a thickness approximately equivalent to that of the flexible board 13, for example, approximately 50 to 150 µm, preferably approximately 100 µm.

The first and second insulating layers 111, 113 are formed by curing prepregs. The first and the second insulating layers 111, 113 each have a thickness of approximately 50 to 100 µm, preferably approximately 50 µm.

The above prepregs are preferably formed of a resin having low flow properties. The prepregs as described above may be formed by impregnating glass clothes (111a, 113a), each of which is an inorganic material, with an epoxy resin, followed by thermal curing of the resin to increase the curing degree thereof beforehand. Furthermore, inorganic materials (111b, 113b), such as silica filler or glass filler, may be added to the resin.

In addition, the prepregs described above can also be formed by impregnating glass clothes with a resin having a high viscosity, impregnating glass clothes with a resin containing inorganic filler, for example, silica filler, or by decreasing the amount of a resin to be used for impregnation of glass clothes.

The first and the second insulating layers 111, 113 cover the front and the rear surface sides of the non-flexible substrate 112 and the flexible board 13 and partly expose the flexible board 13. In addition, the first and the second insulating layers 111, 113 are overlapped together with the cover lays 138, 139 which are at the surfaces of the flexible board 13.

The non-flexible substrate 112 and the first and second insulating layers 111, 113 form a core of the rigid board 11 to support the rigid board 11 and also support and fix the flexible board 13 by sandwiching one end portion thereof.

The non-flexible substrate 112, the flexible board 13, and the first and second insulating layers 111, 113 form a space, and a resin 125 is filled in this space. The resin 125 is, for example, a resin seeping from low-flow prepregs forming the first and second insulating layers 111, 113 during the manufacturing and is integrally cured together with the first and second insulating layers 111, 113. Hence, the resin 125 also includes an inorganic material.

Furthermore, in a part of the second insulating layer 113 corresponding to a connection pad (13b) of the wire 133 of the flexible board 13, a via opening (via hole or contact hole) 116 is formed.

In the flexible board 13, at a part corresponding to the via opening 116 (part at which the connection pad (13b) of the conductive layer (13a) is formed), the shield layer 137 and the cover lay 139 of the flexible board 13 are removed. The via opening 116 penetrates the insulating film 135 of the flexible board 13 and exposes the connection pad (13b) of the conductive layer 133.

On the inner surface of the via opening 116, a conductive layer 117 (may also be referred as "vias," "via hole conductor structure," or "via contact") made by copper plating or the like is formed. The conductive layer 117 (may also be referred as a via, a via hole conductor structure, or a through hole conductor structure) is connected to the connection pad (13b) of the conductor layer 133 of the flexible board 13 by plating. In addition, the via opening 116 is filled with a resin, such as a resin containing an inorganic material.

On the second insulating layer 113, an extending pattern 118 connected to the conductive layer 117 is formed. The extending pattern 118 may be formed of a copper plating layer or the like.

In addition, at a front end of the second insulating layer 113, that is, at a position extending over a boundary between the flexible board 13 and the non-flexible substrate 112, a copper pattern 124 isolated from the others is disposed. Hence, heat generated in the rigid board 11 is effectively dissipated.

The first upper insulating layer 114 is disposed so as to be laminated on the second insulating layer 113. The first upper insulating layer 114 may be formed by curing a material containing an inorganic material, such as silica filler, glass filler, carbon fibers, or ceramic fibers. e.g., prepregs having glass clothes impregnated with a resin. By the structure as described above, dropping impact resistance is improved.

In a manufacturing process of this flex-rigid wiring board, the via opening 116 is filled with a resin containing an inorganic material, which is supplied from the prepregs.

In addition, on the first upper insulating layer 114, the second upper insulating layer 115 is disposed. The second upper insulating layer 115 may be formed by curing prepregs made: of glass clothes impregnated with a resin containing an inorganic material such as silica filler or glass filler.

In the first upper insulating layer 114 disposed on the second insulating layer 113, a via opening (first upper via opening) 119 connected to the extending pattern 118 is formed.

The via opening 119 is filled with a conductor 120 (may also be referred to as "upper vias," "upper via hole conductor structure," or "upper via contact") made of copper or the like. In addition, in the second upper insulating layer 115 laminated on the first upper insulating layer 114, a via opening (second upper via opening) 121 connected to the via opening 119 is, formed. The via opening 121 is filled with a conductor 122 (also referred to as "vias," "via hole conductor structure," or "via contact"). That is, by vias 120, 122 (may also be referred as "upper via"), a filled buildup via is formed.

On the second upper insulating layer 115, a conductive pattern (circuit pattern) 123 is appropriately formed. The via 120 is also appropriately connected to the above conductive pattern 123.

In addition, the structure of a connection portion between the rigid board 12 and the flexible board 13 is similar to that of between the rigid board 11 and the flexible board 13.

In the flex-rigid wiring board 10 having the above structure, the end portion of the flexible board 13 is sandwiched by the first and second insulating layers 111, 113 forming the rigid board 11 and is overlapped.

Furthermore, the connection pad (13b) of the conductive layer 133 of the flexible board 13 and the conductive pattern 123 of the rigid board 11 are connected to each other via the copper plating layer 117 (may also be referred as "via," "via hole conductor structure," or "through-hole conductor structure") formed in the via opening 116 which is formed in the second insulating layer 113 and the insulating film 135.

Hence, when the flexible board 13 is bent, a stress applied thereto is not transmitted to the connection portion (via opening 116 and the layer 117) of the rigid board 11. As a result, a stress applied to the connection portion between the rigid board 11 and the flexible board 13 is small, and hence the reliability is high.

In particular, the insulating layers 111, 113 contain the inorganic materials (111a, 111b, 113a, 113b), such as glass clothes, silica filler, glass filler, carbon fibers, and ceramic fibers. The inorganic materials mentioned above have high rigidity as compared to that of a resin which is an organic material. Hence, compared to the case in which the insulating layers 111, 113 are entirely formed of a resin, the rigidity of the insulating layers 111, 113 is high. Accordingly, even when the flexible board 13 is bent, the core is not substantially deformed. As a result, a stress is not likely to be transmitted to the connection portion between the rigid board 11 and the flexible board 13. In addition, as the inorganic material, particularly, glass cloth is preferable. Compared to other inorganic materials, the glass cloth can most improve the rigidity of the insulating layers 111, 113. Accordingly, in the case in which the insulating layers 111, 113 contain the glass clothes (111a, 113b), even when the flexible board 13 is bent, the core is not deformed, and hence, a stress is not likely to be transmitted to the connection portion between the flexible board 13 and the rigid board 11.

In addition, the conductive layer 133 of the flexible board 13 and the layer 117 inside the via opening 116 are connected to each other by plating. Hence, the reliability of the connection portion is high.

Furthermore, in the via opening 116, the resin of the upper insulating layer 114 is filled. The via opening 116 is fixed and supported by the resin therein, and the connection reliability between the via 117 and the conductive layer 133 is improved.

In addition, the end surfaces of the insulating layers 113, 111 at the flexible board side protrude further than the end surface of the upper insulating layer 114 at the flexible board side. Hence, when the flexible board 13 is bent, a stress applied to the flexible board 13 is not transmitted to the connection portion (the via opening 116 and the via 117) of the rigid board 11. As a result, a stress applied to the connection portion between the rigid board 11 and the flexible board 13 is small, and hence the reliability is high.

In addition, the structure is formed so that the core portion of the rigid board 11 restrains expansion and contraction of the flexible board 13, which tends to expand and contract, in a horizontal direction. Hence, bending reliability and heat-resistance reliability are high. Since a flexible substrate portion of the flexible board 13 is exposed between the rigid boards 11, 12, compared to the case in which the entire structure is covered with in insulating resin or the like, when bending is performed, a stress applied to wires or the like is small.

In addition, the flex-rigid wiring board 10 has the structure in which the end portion of the flexible board 13 is sandwiched by the first and second insulating layers 111, 113 of the rigid board 11. Hence, the influence of change in dimension of the flexible board 13 is small, and as a result, for example, the deviation in placement position of a connection land (via 117) of the rigid board 11 can be decreased. Accordingly, the diameter of the via opening 116 can also be designed to be small.

In addition, the insulating layers 111, 113 contain inorganic materials (111a, 111b, 113a, 113b), such as glass clothes, silica filler, glass filler, carbon fibers, and ceramic fibers. Compared to a resin which is an organic material, the inorganic materials mentioned above have a small coefficient of thermal expansion and make small expansion and contraction. Hence, compared to the case in which the insulating layers 111, 113 are entirely formed of a resin, the positional deviation of the connection land is small, and the connection land can be formed to be small.

In addition, in the rigid boards 11, 12, the flexible board 13 is not disposed. Hence, reliability approximately equivalent to that of a conventional rigid board can be maintained. In addition, resistance against a plating solution is high, and hence a general plating solution can be used. Since a flexible material is also not used for the rigid portion, heat resistance equivalent to that of a usual rigid portion can be maintained.

Furthermore, since the flexible substrate 13 is partly used and is effectively disposed, the manufacturing cost can be reduced.

The upper insulating layers 114, 115 may be formed of usual prepregs. The usual prepregs have good conformity with interlayer patterns when being provided therebetween. Hence, insulation degradation caused, for example, by generation of voids can be avoided. In addition, a fine pattern, for example, (L/S=60/60, 50/50 μm) can be realized. Furthermore, material control can be performed in a restricted manner.

In addition, as the upper insulating layers 114, 115, a usual interlayer material (prepregs) may be used. Hence, in a manufacturing process, IVH (Interstitial Via Hole) including the via opening 116 can be filled with a resin forming the upper insulating layers 114, 115. As a result, a resin exclusively for filling the via is not required.

Since a glass epoxy substrate is used for the core portion of the rigid board 11, dropping impact resistance is improved.

In this embodiment, in order to facilitate the understanding, only on the upper surfaces of the rigid boards 11, 12, the conductive patterns are formed. However, the present invention is not limited to such an example. For example, as shown in FIG. 3, conductive patterns may be disposed at the lower sides of the rigid boards 11, 12.

Figure 3:
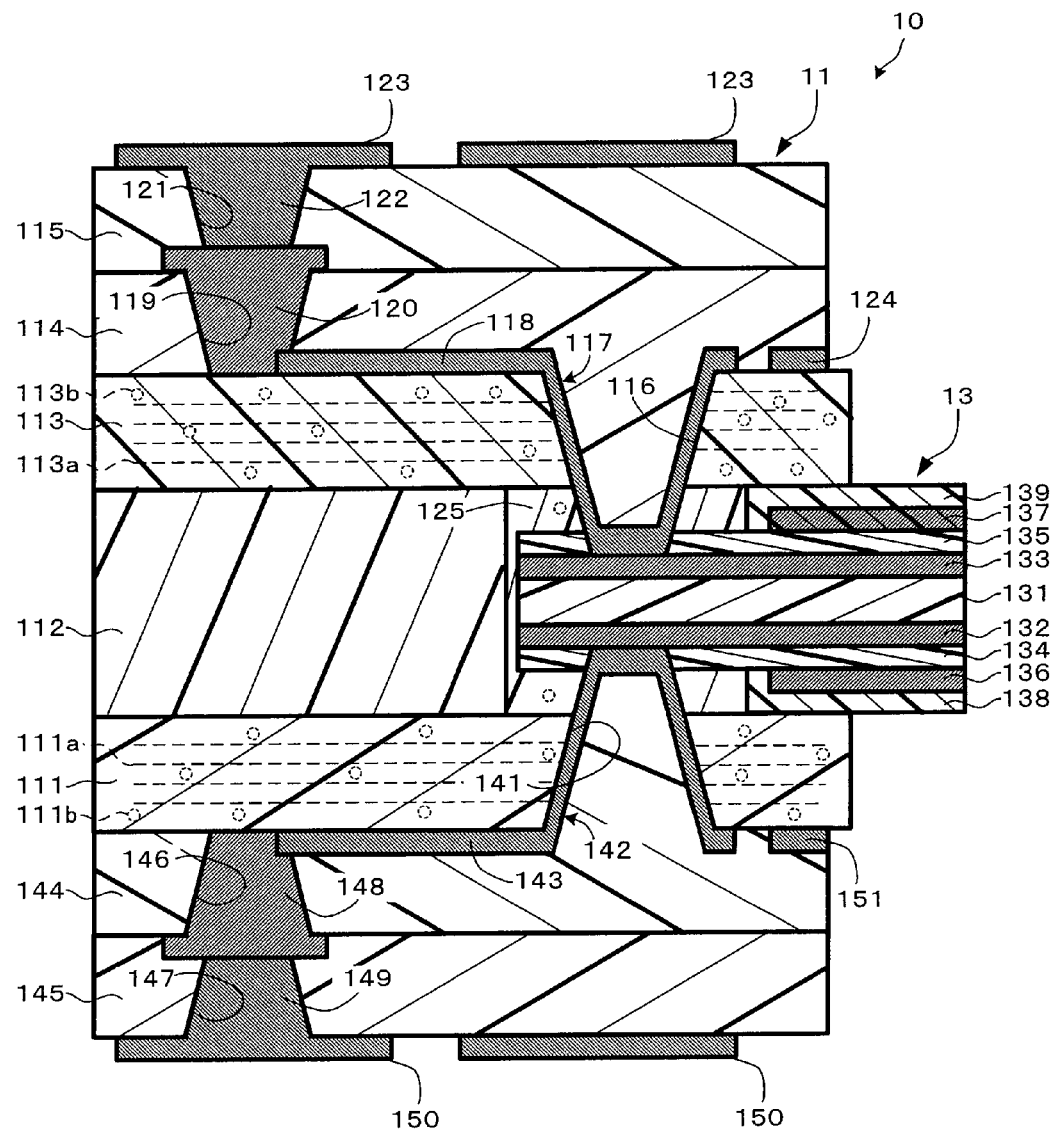
FIG. 3 is a view showing a modification of the flex-rigid wiring board shown in FIG. 2.

In the structure shown in FIG. 3, a via opening 141 is formed in the first insulating layer 111 and the insulating film 134 of the flexible board 13. In the via opening 141, a conductive pattern 142 is formed and is connected to an extending pattern 143 formed on the first insulating layer 111. The conductive pattern 142 and the extending pattern 143 are formed by patterning a copper plating layer.

On the first insulating layer 111, third and fourth upper insulating layers 144, 145, which contain an inorganic material, are laminated. In the third and fourth upper insulating layers 144, 145, via openings 146, 147 are formed. The via openings 146, 147 are filled with conductors 148, 149 (also referred to as "vias," "via hole conductor structure," or "via contact"). On the upper insulating layer 145, a conductive pattern 150 is formed.

Next, a method for manufacturing the flex-rigid wiring board 10 having the above structure will be described.

First, a method for manufacturing the flexible board 13 is described according to one embodiment of the present invention.

Copper films are formed on two surfaces of the polyimide substrate 131 processed into a predetermined size. Next, by patterning the copper films, the conductive layers 132, 133 having the wire patterns (13a) and the connection pads (13b) are formed.

On the polyimide substrate 131 and the two conductive layers 132, 133, the insulating films 134, 135 each made of a polyimide layer or the like are formed. In addition, a silver paste is coated on the flexible board 13 other than the end portion thereof and is then cured, so that the shield layers 136, 137 are formed.

Subsequently, the cover lays 138, 139 are formed so as to cover the shield layers 136, 137 located at the front surface and the rear surface sides, respectively.

Figure 4:
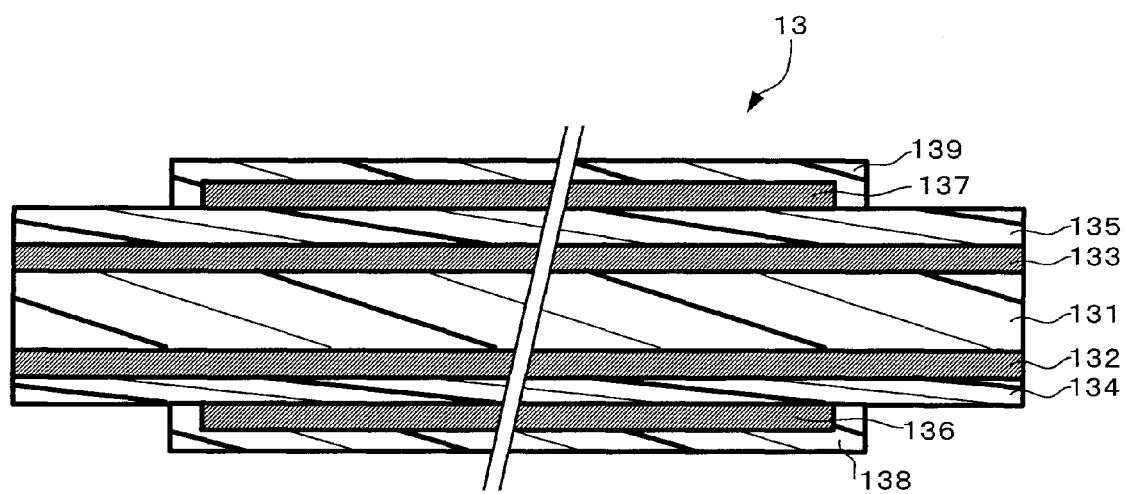
FIG. 4 is a side view of a flexible substrate.

As described above, the flexible board 13 having the structure shown in FIG. 4 is formed. In this structure, the shield layers 136, 137 and the cover lays 138, 139 are formed at places other than those for the connection pads (13b).

Next, a method for bonding the rigid boards 11, 12 to the flexible board 13 is described.

Figure 5A:
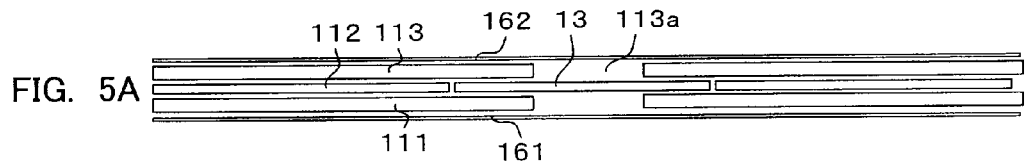
FIGS. 5A to 5L are a flowchart illustrating a manufacturing method of a flex-rigid wiring board according to another embodiment of the present invention.

First, as shown in FIG. 5A, the first insulating layer 111, the non-flexible substrate 112, and the second insulating layer 113, which form the core of the rigid board 11, are aligned. In this case, the first and the second insulating layers 111, 113 are formed, for example, of low flow prepregs containing inorganic materials (111a, 111b, 113a, 113b), and having a thickness of approximately 20 to 50 μm, and the non-flexible substrate 112 is formed, for example, of a glass epoxy substrate having a thickness of approximately 100 μm. The low flow prepregs as described above are formed, for example, by impregnating the glass clothes (111a, 113a), which are an inorganic material, with an epoxy resin added with the inorganic materials (111b, 113b), such as silica filler or glass filler, or by thermally curing of an epoxy resin added with the inorganic materials (111b, 113b), such as silica filler or glass filler, beforehand to increase the curing degree.

In this embodiment, as shown in FIG. 2, the thickness of the non-flexible substrate 112 and the thickness of the flexible board 13 are preferably approximately equivalent to each other. According to the structure described above, in a space present between the non-flexible substrate 112 and the cover lay 139, the resin 125 containing the inorganic materials (111b, 113b) can be filled, and the flexible board 13 and the non-flexible substrate 112 can be securely adhered to each other.

In addition, since the resin 125 filled in the space is integrally cured with the insulating layer 113, the periphery of the via opening 116 is fixed by the resin 125, and hence the connection reliability between the via 117 and the conductive layer 133 is improved.

In the same manner as described above, a non-flexible substrate and first and second insulating layers, which form a core of the rigid board 12, are aligned.

Furthermore, one end portion of the flexible board 13 is sandwiched between the first and second insulating layers 111, 113 of the rigid board 11 for positioning, and the other end portion is disposed between the non-flexible substrate and the first and second insulating layers of the rigid board 12. Furthermore, conductive films 161, 162 (also referred as "copper foils") made of copper or the like are disposed on the top and the bottom of a structure thus formed. A separator may be provided on the flexible board 13 before conductor films 161,162 is disposed on and below these layers.

Figure 5B:
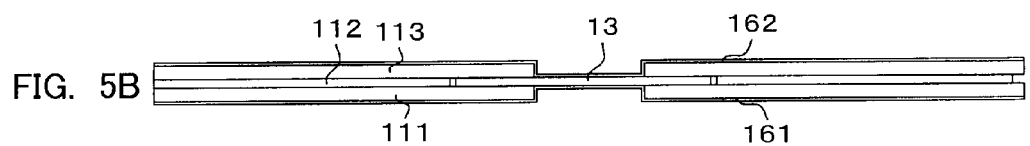
Figure 6A:
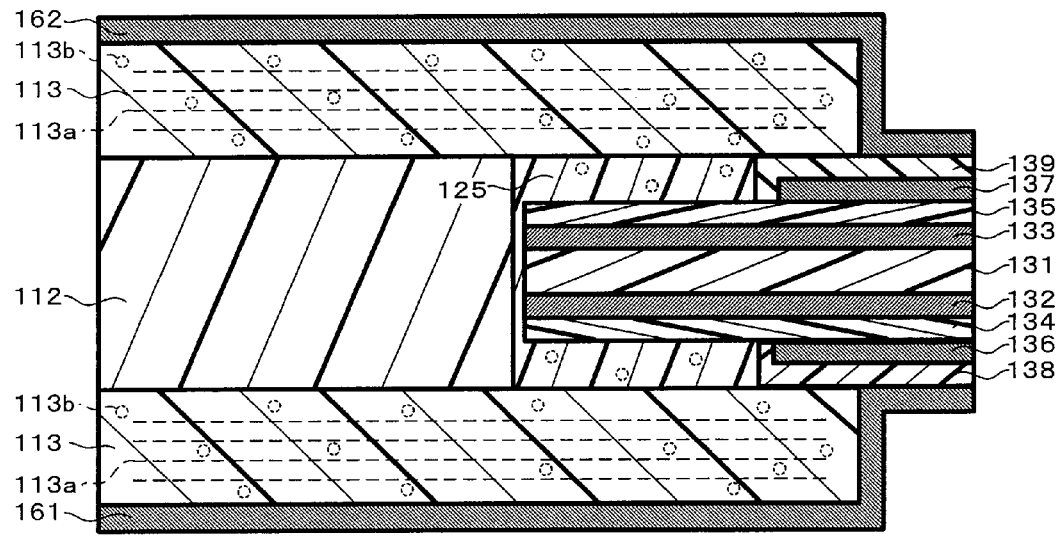
FIGS. 6A to 6F are enlarged views illustrating the manufacturing method of a flex-rigid wiring board, which is illustrated with reference to FIGS. 5A to 5L.

Next, as shown in FIG. 5B, the above structure is pressed under pressure. In this step, as shown by an enlarged view of FIG. 6A, the resin 125 containing the inorganic materials (111b, 113b), which is extruded from the prepregs forming the first and second insulating layers 111, 113, fills the space between the non-flexible substrate 112 and the flexible board 13. As described above, since the space is filled with the resin 125, the flexible board 13 and the non-flexible substrate 112 can be securely adhered to each other.

The above pressure pressing may be performed, for example, by a hydraulic press apparatus under conditions in which the temperature, the pressure, and the press time are set to approximately 200° C., 40 kgf, and 3 hours, respectively.

Subsequently, for example, by heating the whole structure, the prepregs forming the first and second insulating layers 111, 113 and the resin 125 are cured and are integrated together. In this step, the cover lays 138, 139 of the flexible board 13 and the resin of the first and second insulating layers 111, 113 are overlapped. When the resin of the insulating layers 111, 113 is overlapped, the periphery of the via opening 116 is fixed by the resin, and the connection reliability between the via 117 and the conductive layer 133 is improved.

Figure 5C:
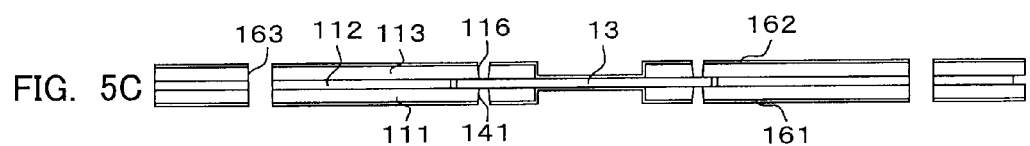
Figure 6B:
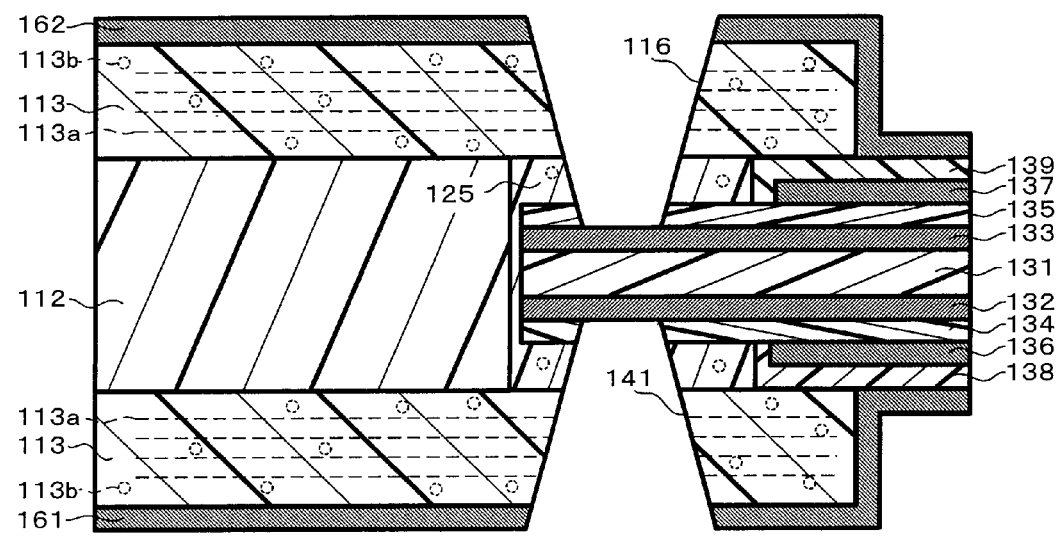

Next, for example, by irradiation of $CO_2$ laser from a $CO_2$ laser processing device, IVH (Interstitial Via Hole) 163 is formed as required as shown in FIG. 5C. In this case, as shown by an enlarged view of FIG. 6B, the via openings 116, 141 are also formed to connect the wire layers 132, 133 of the flexible board 13 to the rigid boards 11, 12.

Figure 5D:
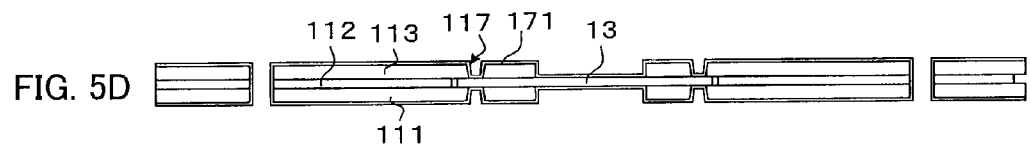
Figure 6C:
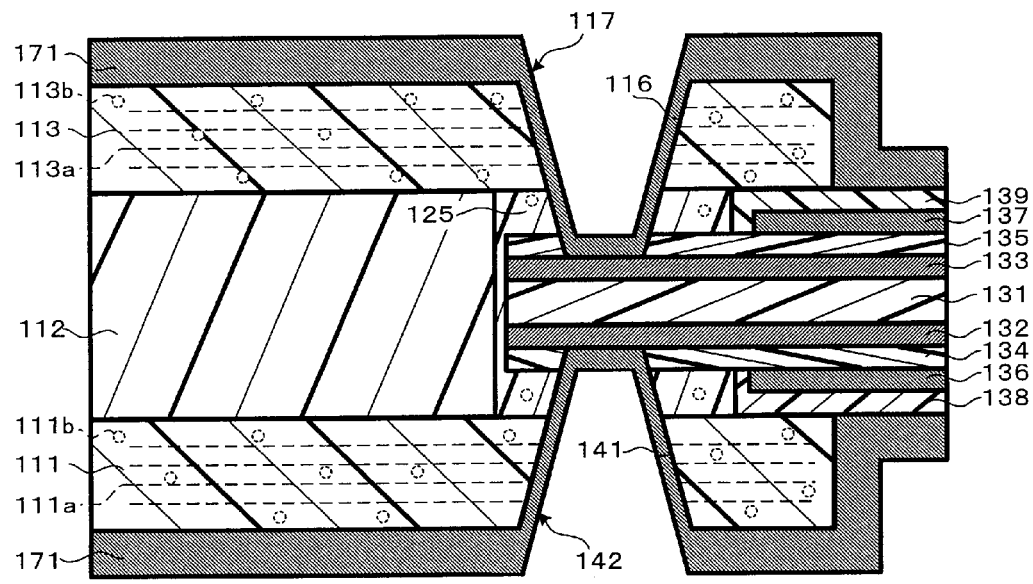

Subsequently, as shown in FIG. 5D, the entire surface of the structure is processed by copper plating. This copper plating and the existing copper patterns 161, 162 are integrated together, and hence a copper film 171 is formed over the entire surface of the board. As shown in FIG. 6C, the copper film 171 is also formed inside the via openings 116, 141. In this step, the flexible board 13 is covered with the copper foils 161, 162 and hence is not directly brought into contact with a plating solution. Hence, the flexible board 13 is not damaged by a plating solution.

Figure 5E:
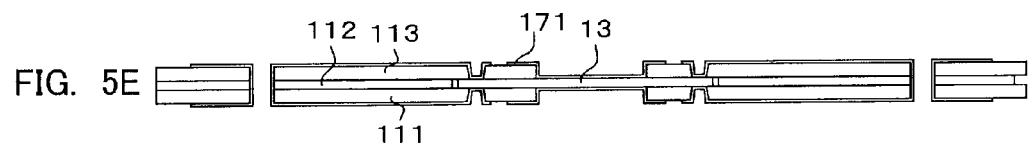
Figure 6D:
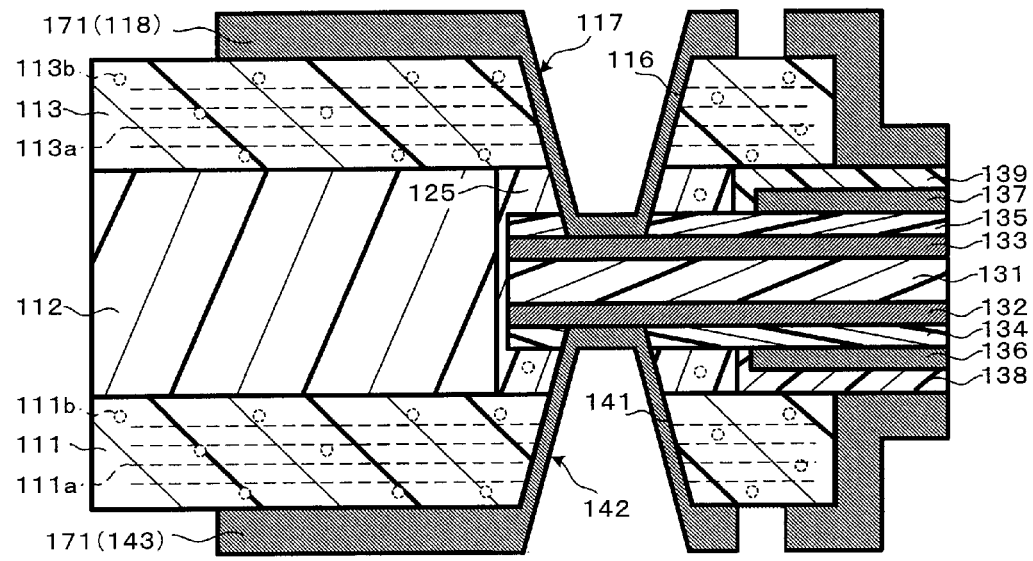

Subsequently, as shown in FIG. 5E, the copper film 171 located at the board surface is patterned. By this step, the vias 117, 142 connected to the conductive layers 132, 133 of the flexible board 13 and the extending patterns 118, 143 are formed. In this step, as shown in FIG. 6D, the copper foil 171 is allowed to remain at the edge portions of the first and second insulating layers 111, 113.

Figure 5F:
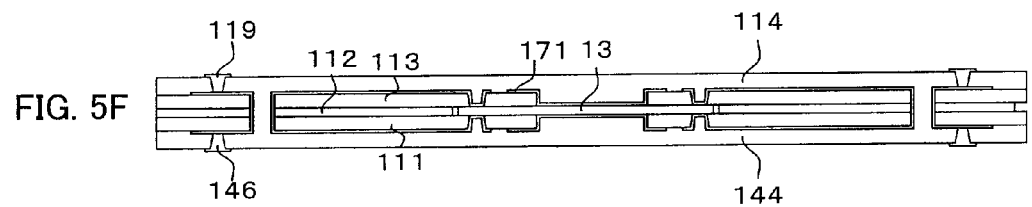

Next, as shown in FIG. 5F, on the top and bottom of a resulting structure, the first and third upper insulating layers 114, 144 mat be disposed. The first and third upper insulating layers 114, 144 may be formed, for example, of prepregs made of glass clothes, which are an inorganic material, impregnated with a resin containing an inorganic material such as silica filler or glass filler. The via openings 116, 141 are filled with the resin forming the prepregs.

Subsequently, for example, by curing the resin of the prepregs and inside the via openings by heating, the first and third upper insulating layers 114, 144 are solidified. Then, via openings 119, 144 are formed in the first and third upper insulating layers 114, 144, and by copper plating or the like, the via openings 119, 144 are filled with a conductive material. Alternatively, a conductive paste (for example, a thermosetting resin containing conductive particles) may be filled in the via openings 119, 114 by screen printing or the like, followed by curing.

Figure 5G:
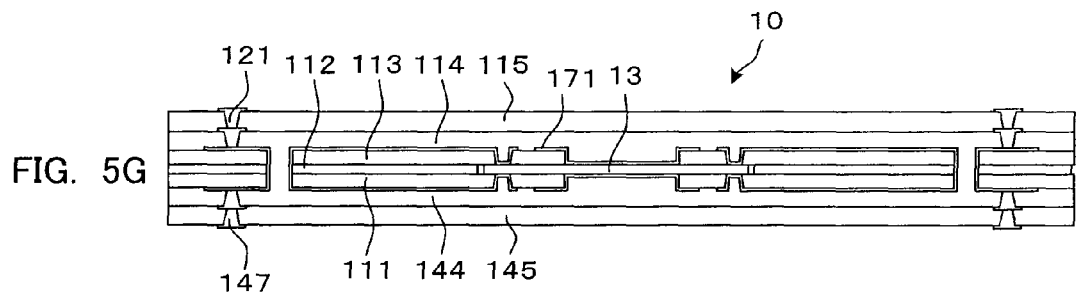

Next, is shown in FIG. 5G, on the top and bottom of the entire board, the second and fourth upper insulating layers 115, 145 are disposed. The second and fourth upper insulating layers 115, 145 may be formed, for example, of usual prepregs made of glass clothes, which are an inorganic material, impregnated with a resin containing an inorganic material such as silica filler or glass filler. Before the second and fourth upper insulating layers 115,145 are formed, a separator may be disposed in an opening formed in the first and third upper insulating layers 114, 144.

Subsequently, for example, by curing the resin of the prepregs by heating, the second and fourth upper insulating layers 115, 145 are solidified.

Furthermore, via openings 121, 147 are formed in the second and fourth upper insulating layers 115, 145, and by copper plating or the like, the via openings 121, 147 are filled with a conductive material. Alternatively, a conductive paste (for example, a thermosetting resin containing conductive particles) may be filled in the via openings 121, 147 by screen printing or the like, followed by curing. When the same conductive paste material is filled in the via openings 121, 147, the connection reliability is improved when a thermal stress is applied to the vias 122, 149 (also referred as "upper vias").

Figure 5H:
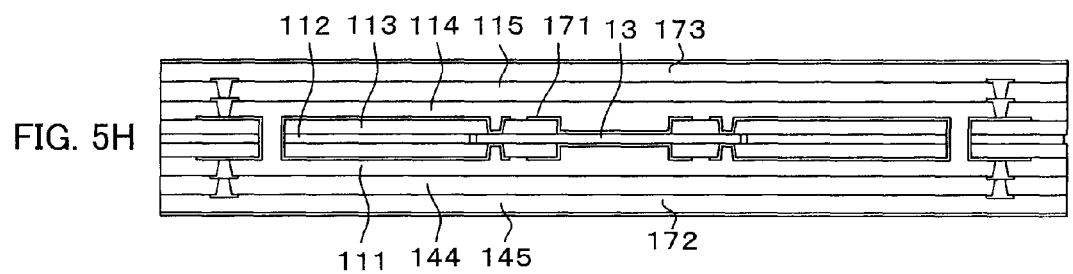

Furthermore, as required, as shown in FIG. 5H, resin provided with copper foil sheets (Resin Copper Film; RCF) 172, 173 may be disposed as the outermost layers of the board, followed by pressing.

Subsequently, the entire structure is heated, so that the resin is cured.

Figure 5I:
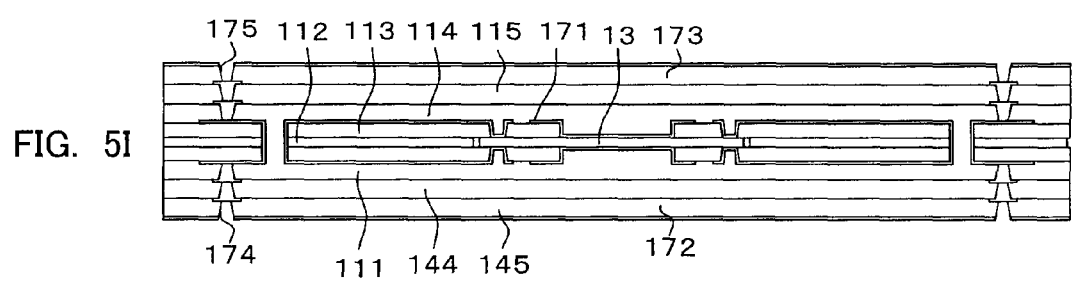

Then, as shown in FIG. 5I, via openings 174, 175 are formed in the RCFs 172, 173. Next, by copper plating or the like, the via openings 174, 175 are filled with a conductive material. In addition, as required, the copper foil located at the surface is patterned to form a conductive pattern.

Figure 5J:
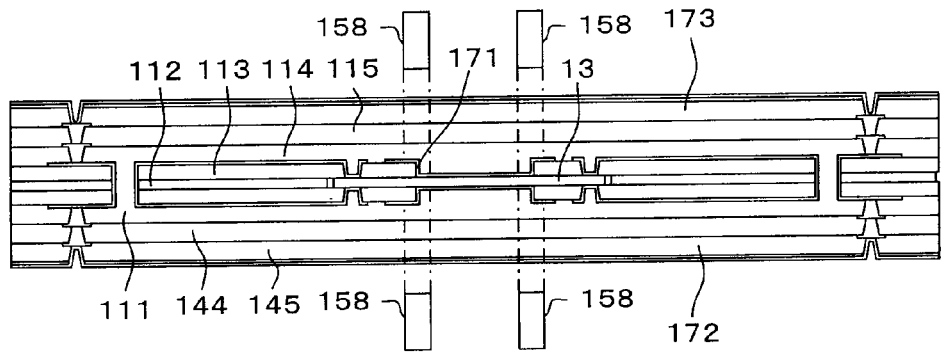
Figure 6E:
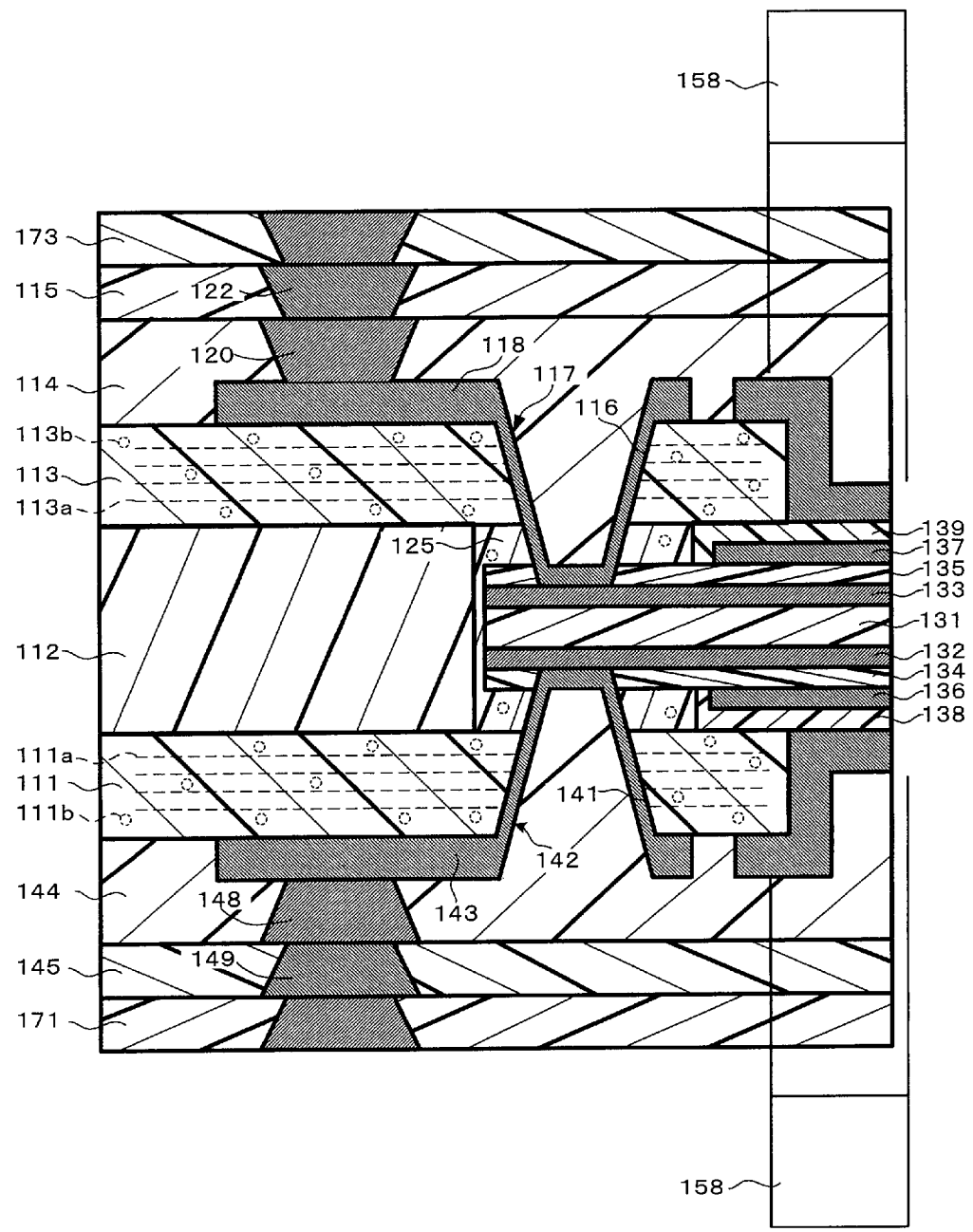
Figure 6F:
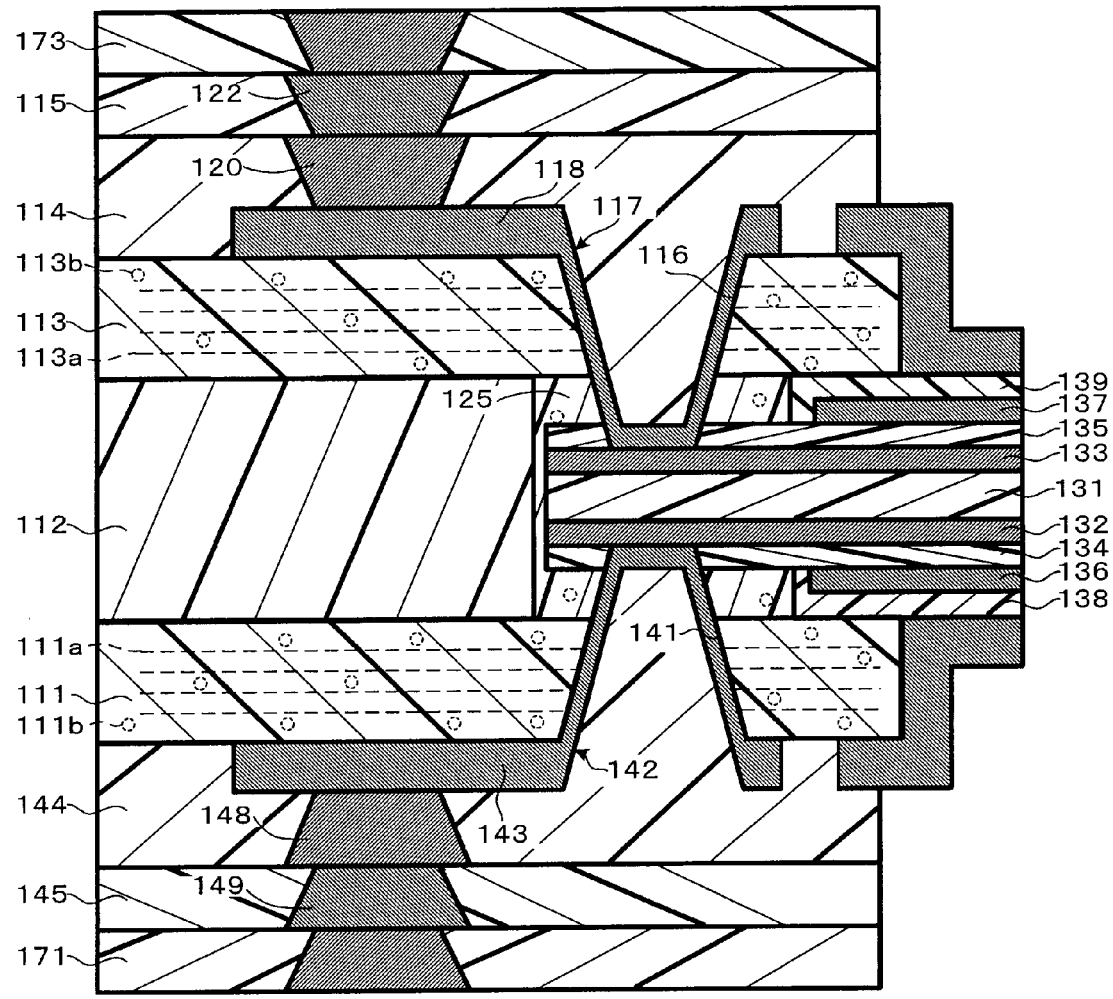

Next, as shown in FIGS. 5J and 6E, bonding portions of the flexible board 13 with the rigid boards 11, 12 are irradiated with laser beam 158, such as $CO_2$ laser, generated from a laser processing device, so that the upper insulating layers 114, 115, 144, 145, and the resin with copper foil sheets (RCFs) 172, 173 are cut, using the copper foil 171 formed on the edge portions of the cores of the rigid boards 11, 12 as a stopper. In this step, the energy or the irradiation time is adjusted so as to cut the copper foil 171 used as the stopper to a certain extent.

Accordingly, as shown in FIG. 5H, a structure 181 on the flexible board 13 is separated from the others.

Figure 5K:
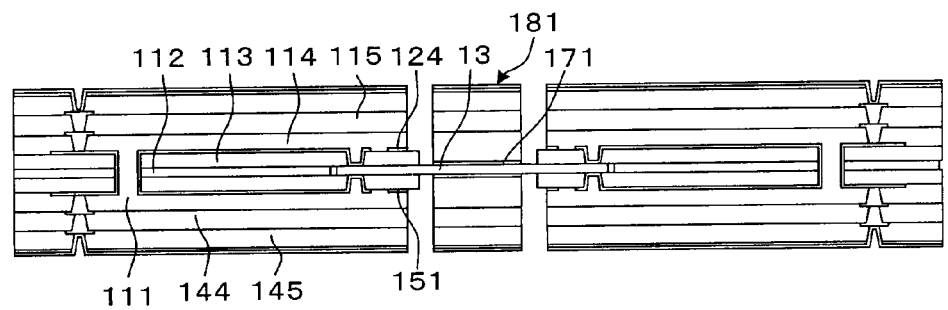
Figure 5L:
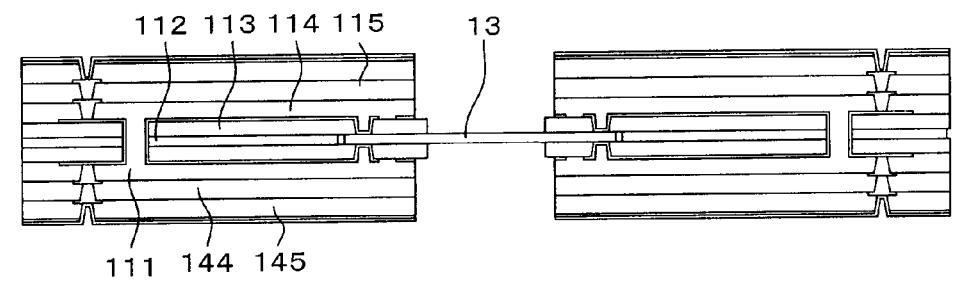
Figure 5A:
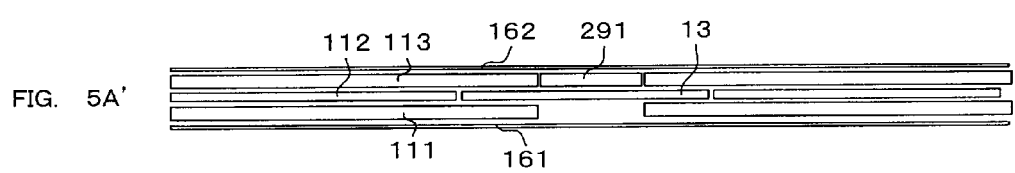
Figure 5G:
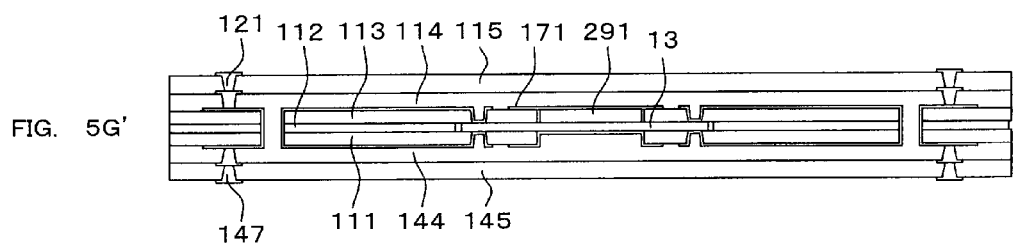
Figure 5K:
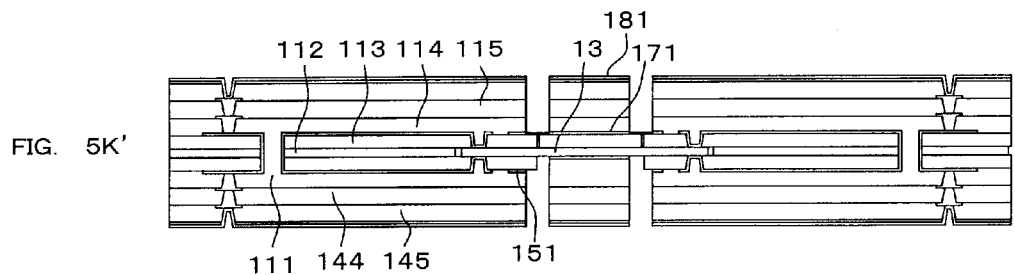
Figure 5L:
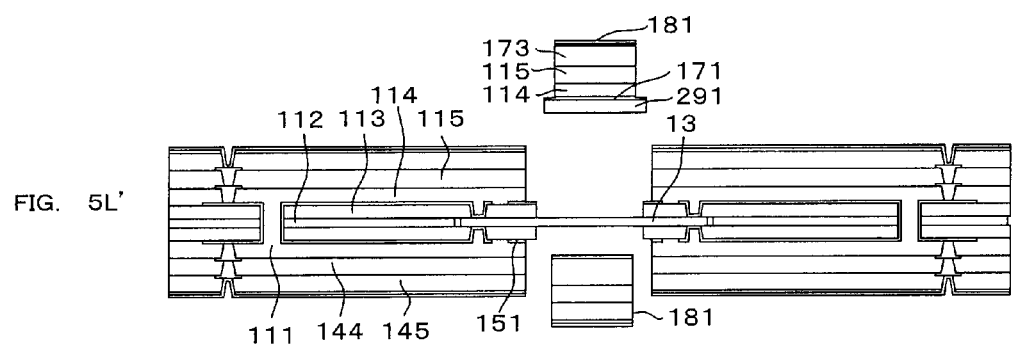

Next, as shown in FIG. 5L, the structure 181 is removed by peeling off from the flexible board 13. The copper foils 161, 162 (see FIG. 5B), from which the remaining copper foil 171 is formed, are simply pressed on the cover lays 138, 139 and are not fixedly bonded thereto. In the same manner as described above, the copper foil 171 is also not fixedly bonded to the flexible board 13. Hence, when the structure 181 is removed, the copper foil 171 is also removed.

As described above, parts of the copper foil 171, which are not covered by other components, are removed. Hence, at the edge portions of the first and second insulating layers 111, 113, the copper foils 124, 151, which are covered with the prepregs 113, 144, remain.

As described above, the end portions of the flexible board 13 are held by the core portions (the first and second insulating layers 111, 113) of the rigid boards 11, 12, and in addition, lands of the rigid boards 11, 12 and connection pads of the flexible board 13 are connected to each other by plating, thereby forming the flex-rigid wiring board 10.

According to the structure described above, plating on polyimide of the flexible board 13 is not required, and hence the connection reliability is ensured.

In addition, RCF can be used as the outermost layers of the rigid boards 11, 12. Hence, similar reliability and dropping impact resistance as those of a conventional rigid board is ensured.

In this manufacturing method, in order to form the core layers of the rigid boards 11, 13, prepregs made of a resin having low flow properties are used. However, for other than the core layers, usual prepregs may be used, IVH filling is not required, and voids are also not liable to be generated.

Furthermore, since only the bending portion is formed of the flexible board, the stability is improved.

Since openings are formed in multiple layers by laser processing after the external layers are formed, the manufacturing cost is reduced.

In addition, since openings are formed in multiple layers by laser processing after the external layers are formed, the accuracy of the opening in the flexible board is high.

In addition, since the core portions of the rigid boards 11, 12 are formed of a glass epoxy substrate, the dropping impact resistance is improved.

A method for manufacturing the flex-rigid wiring board 10 is not limited to those steps referred in FIGS. 5A to 6L. For example, referring to FIG. 5A', a separator 291 may be provided in a gap (113a) formed in the second insulating layer 113. The separator 291 may be, for example, a cured prepreg or a polyimide film. Also, an adhesive may be provided between the separator 291 and the copper film 171.

In such a case, through the steps shown in FIGS. 5B to 5F, the copper film 171 and the upper insulating layers 114, 115 may be formed over the separator 291 as shown in FIG. 5G'. Subsequently, through the steps shown in FIGS. 5H to 5I, the copper film sheet with resin (Resin Copper Film or RCF) 173 is provided over the upper insulating layer 115, and the via opening 174 is formed and filled with conductive material. Then, the boundary between the upper insulating layer 113 and the separator 291 is cut by the laser beam 158, using the copper film 171 as a stopper. At this time, the energy or irradiation time of the laser beam 158 may be adjusted such that the copper film 171 is cut appropriately to some extent. As such, a structure 181 over the flexible board 13 is separated as shown in FIG. 5K'. Then, the structure 181 may be torn off and removed from the flexible board 13 as shown in FIG. 5L'. The separator 291 makes easier to tear off and remove the structure 181 from the flexible board 13. Also, the separator 291 supports the copper film 171 and prevents a plating solution from seeping into the gap (113a) between the flexible board 13 and the copper film 162 and the copper film 171 from being torn.

Also, referring to FIGS. 5F", 5G", 5K" and 5L", another method for manufacturing the flex-rigid wiring board 10 is described below as a modification from the steps shown in FIGS. 5A to 6L. In this modification, after the separator 291 is provided, the steps described in FIGS. 5B through 5F are carried out. Then, using a laser, a cut line 292 may be formed in a portion of the upper insulating layer 114 above the separator 291 as shown in FIG. 5F". Thereafter, the upper insulating layer 115 is provided over the upper insulating layer 114. However, in the place of a portion of the upper insulating layer 115, a separator 293 having one edge portion reaching over the cut line 292 is provided as shown in FIG. 5G". Subsequently, the resin bearing copper film sheet 173 is provided over the upper insulating layer and the separator 293 by carrying out the steps described in FIGS. 5H and 5I, a via opening is formed in the upper insulating layer 115, and copper plating is conducted. Then, using a laser, cut lines 294, 295 are formed over one edge portion of the separator 291 and over the other edge portion of the separator 293 as shown in FIG. 5K". Finally, as shown in FIG. 5L", a structure 296 defined by the cut line 294, the separator 291, the cut line 292, the separator 293 and the cut line 295 is removed. With such a structure, a portion or portions which do not contribute to the formation of circuitry may be removed and the volume of a wiring board may be reduced.

In the above, the modifications concerning the manufacturing steps related to the rigid board 12 are described. However, such modifications may be applied to the manufacturing steps of the rigid board 11 or both of the rigid boards 11, 12. Also, in the examples described above, the modifications describe the manufacturing steps concerning the upper portions of the flex-rigid wiring board 10. However, such modifications may be applied to the lower portions of the flex-rigid wiring board 10 or the flex-rigid wiring board 10 as a whole.

The flex-rigid wiring board 10 according to one embodiment of the present invention is described above; however, the present invention is not limited to such an example.

For example, the materials, sizes, number of layers described above, and the like may be modified appropriately.

For example, in the above embodiment, the resin 125 and the resin forming the first and second insulating layers 111, 113, the upper insulating layers 114, 115, 144, 145 are described as a resin containing an inorganic material. However, the present invention is not limited to that described above, and for example, as a resin forming the upper insulating layers 114, 115, 144, 145, a resin containing no inorganic materials may be used.

Furthermore, when the first and second insulating layers 111, 113 have the glass clothes (111a, 113a), the resin thereof may not contain an inorganic material.

The materials, forms (clothes, filler, particles, and the like), addition amounts, and content ratios of the inorganic materials contained in the individual components may be appropriately selected and determined in accordance with rigidity, strength, coefficient of thermal expansion, and the like required for the components.

Figure 7:
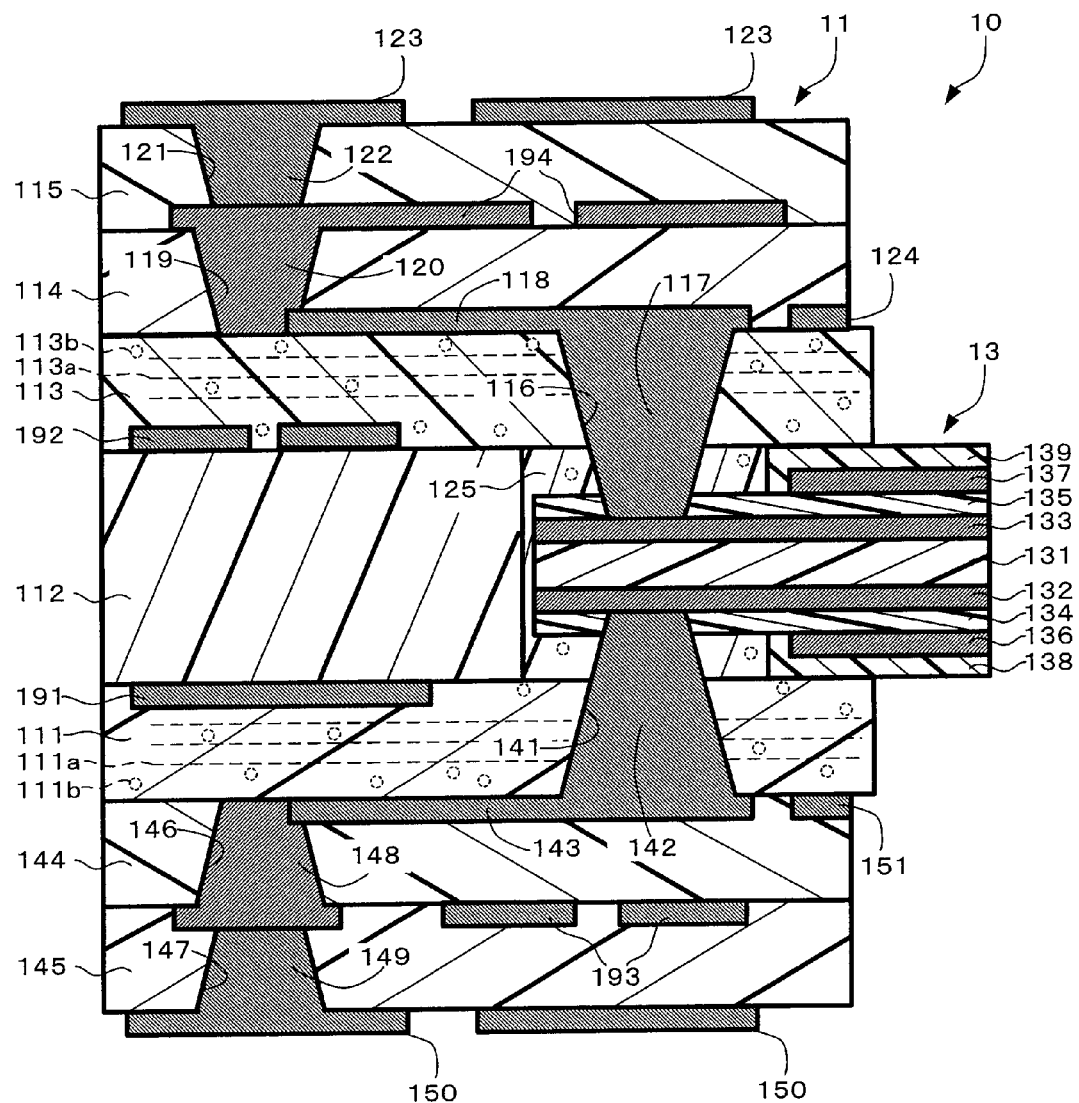
FIG. 7 is a view showing a modification of the flex-rigid wiring board shown in FIG. 3.

In addition, as shown in an example of FIG. 7, the via openings 116, 141 may be filled with a conductive material such as a plating metal. When the via openings 116, 141 are not fully filled with a resin, voids may be present inside the via openings 116, 141. In this case, when heat is applied to the flex-rigid wiring board 10, the connection reliability of the vias may be degraded in some cases due to expansion of the voids. As shown in FIG. 7, when the via openings 116, 141 are filled with a plating metal, the connection reliability of the vias 117, 142 is improved when heat is applied thereto.

As is the case described above, conductive patterns (circuit patterns) 191, 192 may be formed on the non-flexible substrate 112 to be connected to appropriate portions.

In addition, conductive patterns (circuit patterns) 193, 194 may be formed on the upper insulating layers 114, 144 to be connected to appropriate portions.

The conductive patterns 191, 143, 193, 150 are connected to each other through the vias 148, 149 and other appropriately formed vias. In the same manner as described above, the conductive patterns 192, 118, 194, 123 are connected to each other through the vias 120, 122 and other vias. Furthermore, through the via formed in the via opening 163, the conductive patterns 123, 150 are also connected to each other.

In this embodiment, the first and second insulating layers 111, 113, which sandwich the end portion of the flexible board 13, may be formed from RCF. In addition, the first and third upper insulating layers 114, 144 and the second and fourth upper insulating layers 115, 145 may be formed of RCF. Such a structure allows the number of manufacturing, steps to be reduced.

Figure 8:
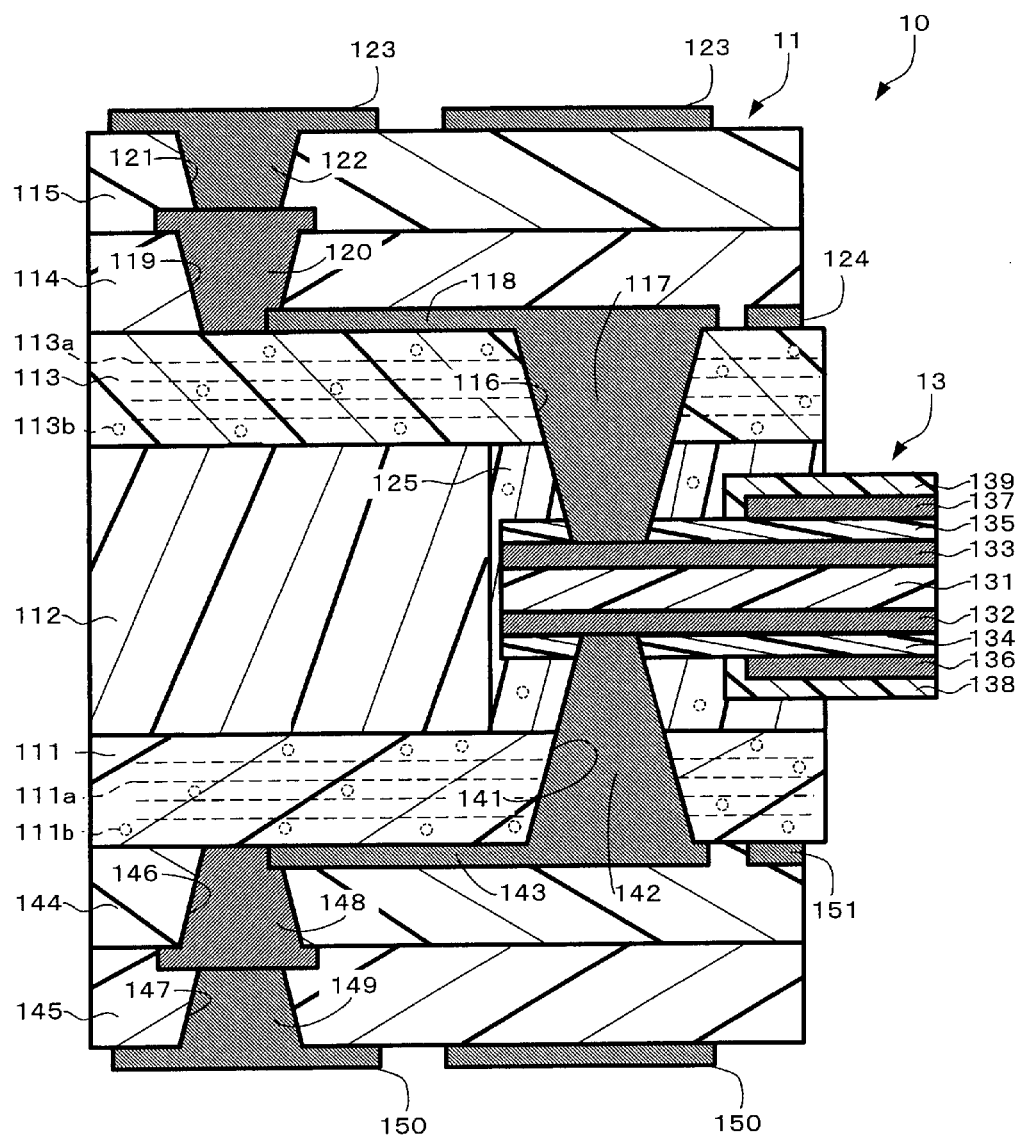
FIG. 8 is a view showing another modification of the flex-rigid wiring board shown in FIG. 3.

In this embodiment, the thickness of the flexible board 13 is set to be approximately equivalent to that of the non-flexible substrate 112; however, the present invention is not limited to such an example. For example, as shown in FIG. 8, the thickness of the flexible board 13 may be formed smaller than that of the non-flexible substrate 112. In this case, a space formed between the flexible board 13, the non-flexible substrate 112, and the first and second insulating layers 111, 113 is filled with an appropriate resin, such as a resin which seeps from the insulating layers 111, 113 or a resin which is provided beforehand in manufacturing for height adjustment. Since the space is filled with the resin 125, the flexible board 13 and the non-flexible substrate 112 are securely adhered to each other.

In addition, those resins are integrally cured and solidified together by heating during manufacturing. As described above, since the resins of the insulating layers 111, 113 are overlapped, and the resin 125 is further integrally cured and solidified, the peripheries of the via openings 116, 141 are fixed by the resins, the connection reliability of the vias 117, 142 with the conductive layer 133, 132 are improved.

Figure 9A:
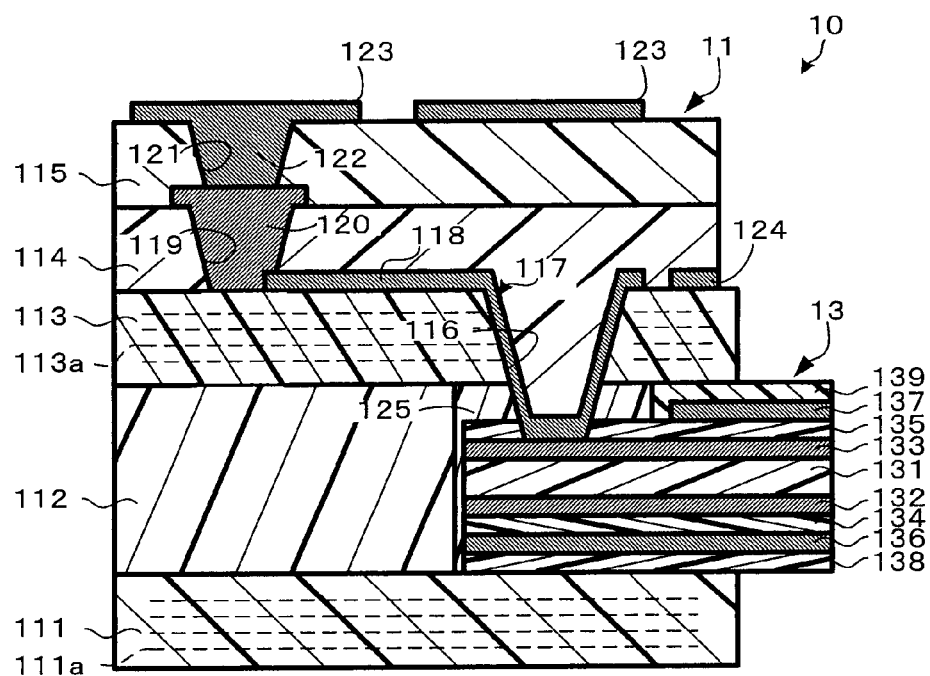
FIGS. 9A and 9B are views each showing a modification of the flex-rigid wiring board shown in FIG. 2.
Figure 9B:
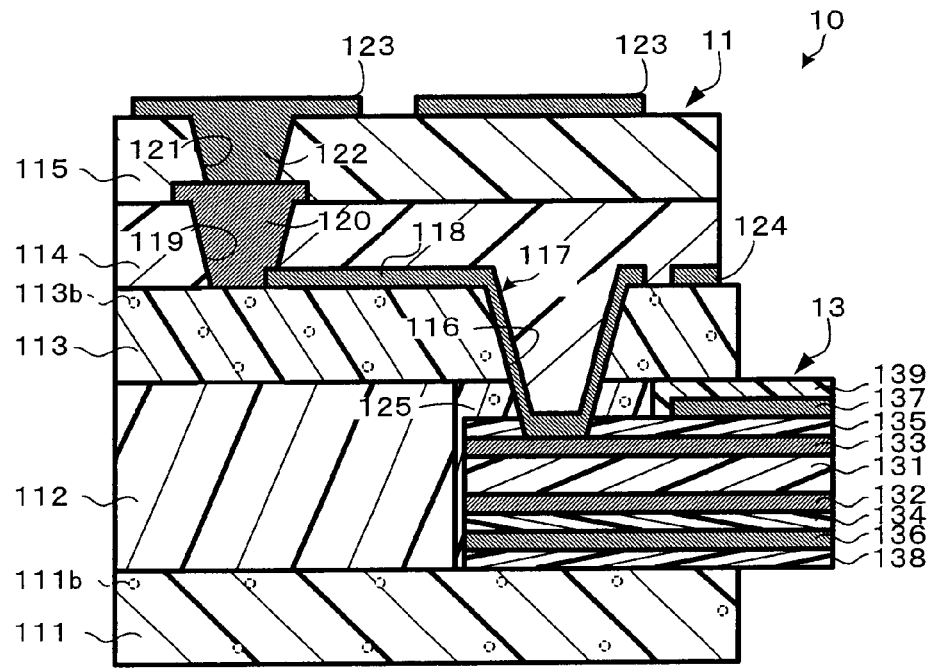

In the embodiment described above, the first insulating layer 111 contains the glass clothes (111a) and the inorganic material (111b), and the second insulating layer 113 contains the glass clothes (113a) and the inorganic material (113b). However, as for the flex-rigid wiring board 10 shown in FIG. 2, for example, the structure may be formed as shown in FIG. 9A in which the first and second insulating layers 111, 113 contain the glass clothes (111a, 113a) and contain no inorganic materials (111b, 113b). In addition, as shown in FIG. 9B, a structure may also be formed such that the first and second insulating layers 111, 113 contain the inorganic materials (111b, 113b) but contain no glass clothes (111a, 113a).

Figure 10A:
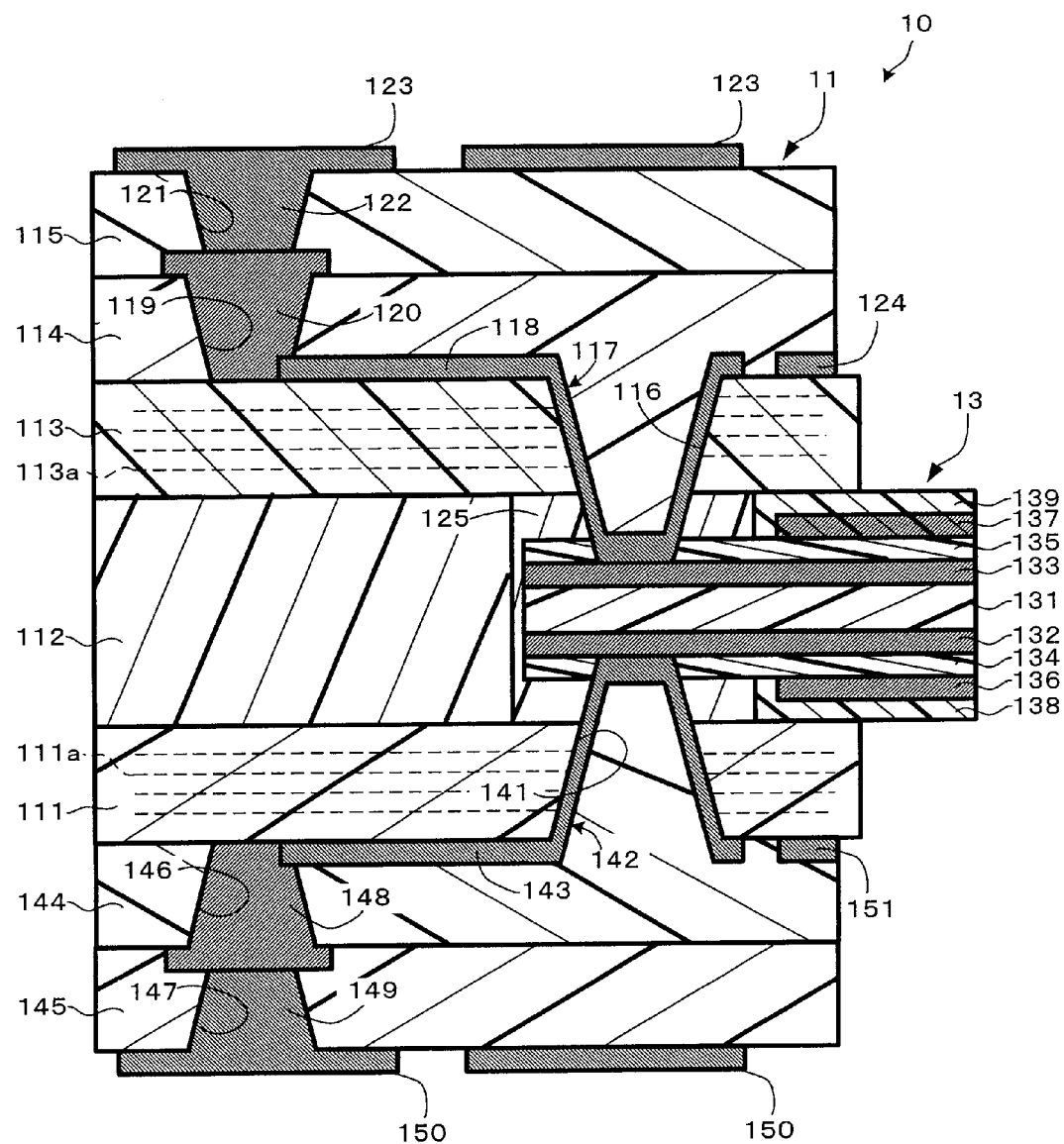
FIGS. 10A and 10B are views each showing a modification of the flex-rigid wiring board shown in FIG. 3.

Furthermore, as for the flex-rigid wiring board 10 shown in FIG. 3, for example, as shown in FIG. 10A, the first and second insulating layers 111, 113 may contain the glass clothes (111a, 113a), respectively, but may not contain the inorganic materials (111b, 113b). In addition, as shown in FIG. 10B, the first and second insulating layers 111, 113 may contain the inorganic materials (111b, 113b), respectively, but may not contain the glass clothes (111a, 113a).

The flex-rigid wiring board 10 having the structure shown in FIG. 10A is manufactured, for example, by the steps shown in FIGS. 5A to 5L and FIGS. 11A to 11F. This manufacturing method is similar to that described with reference to FIGS. 5A to 5L and FIGS. 6A to 6F except that as the first and second insulating layers 111, 113, insulating layers (prepregs) which contain the glass clothes (111a, 113a) but contain no inorganic materials (111b, 113b) are used.

Figure 10B:
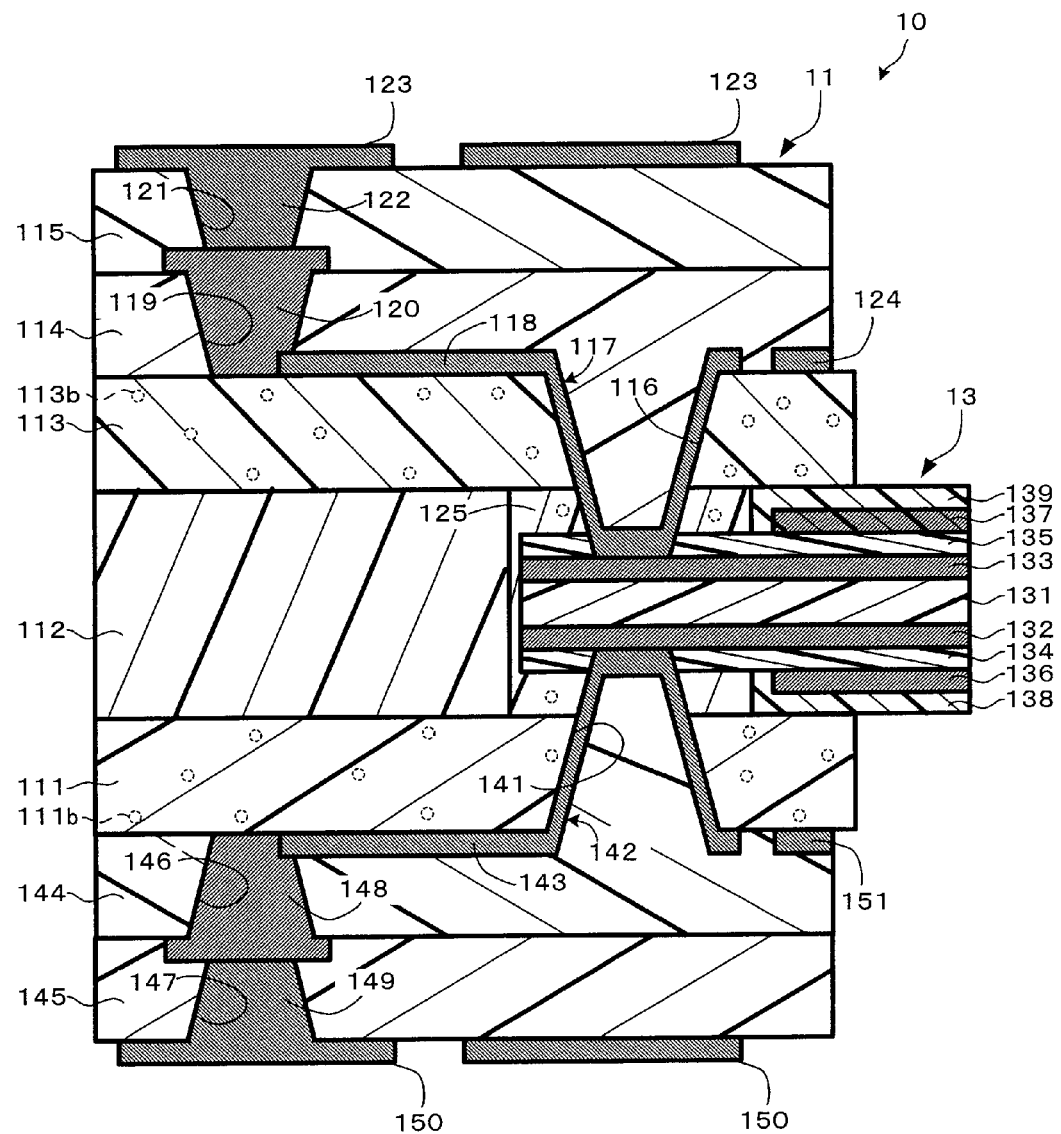
Figure 11A:
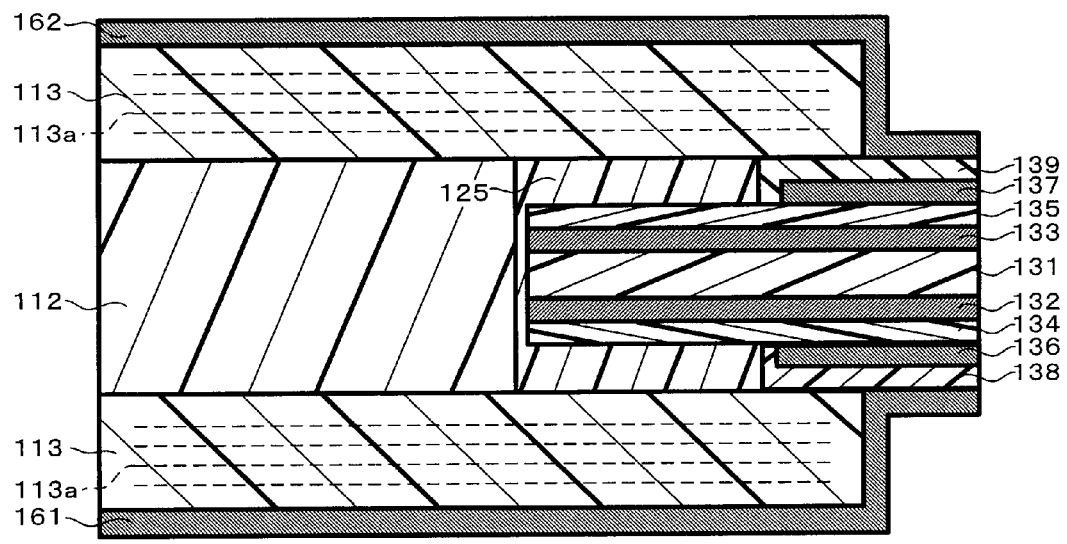
FIGS. 11A to 11F are views illustrating steps of a manufacturing method of the flex-rigid wiring board shown in FIG. 10A.
Figure 11B:
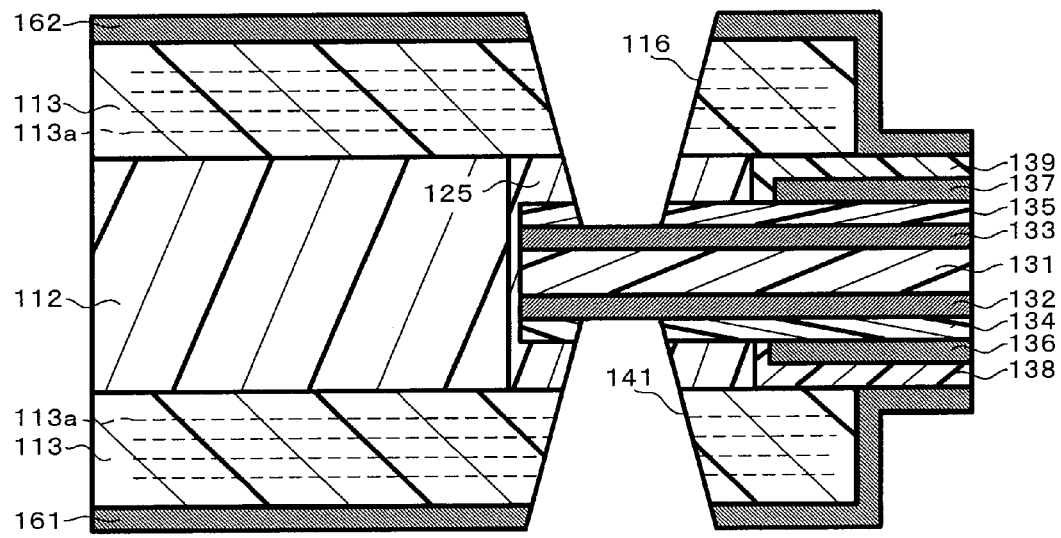
Figure 11C:
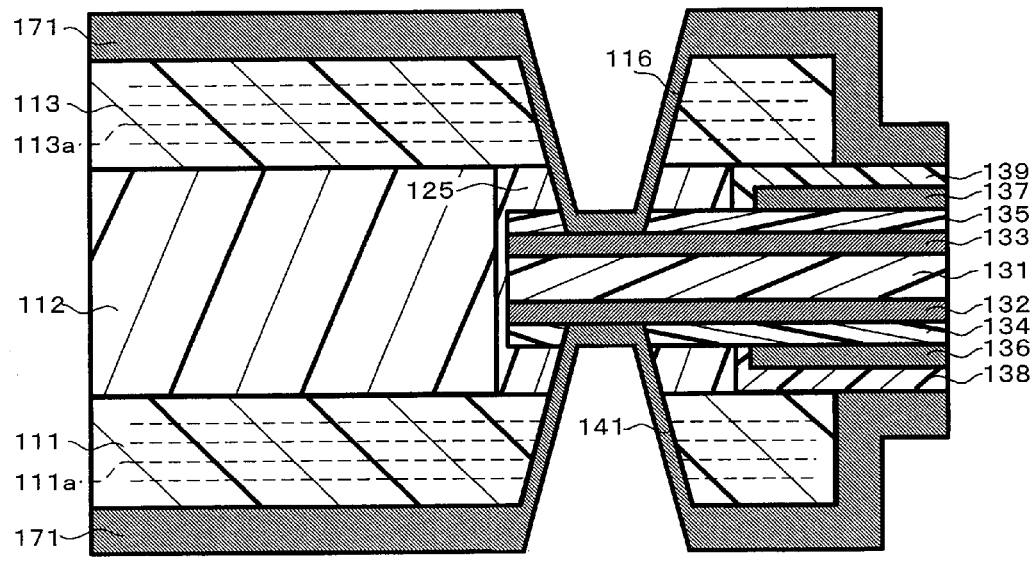
Figure 11D:
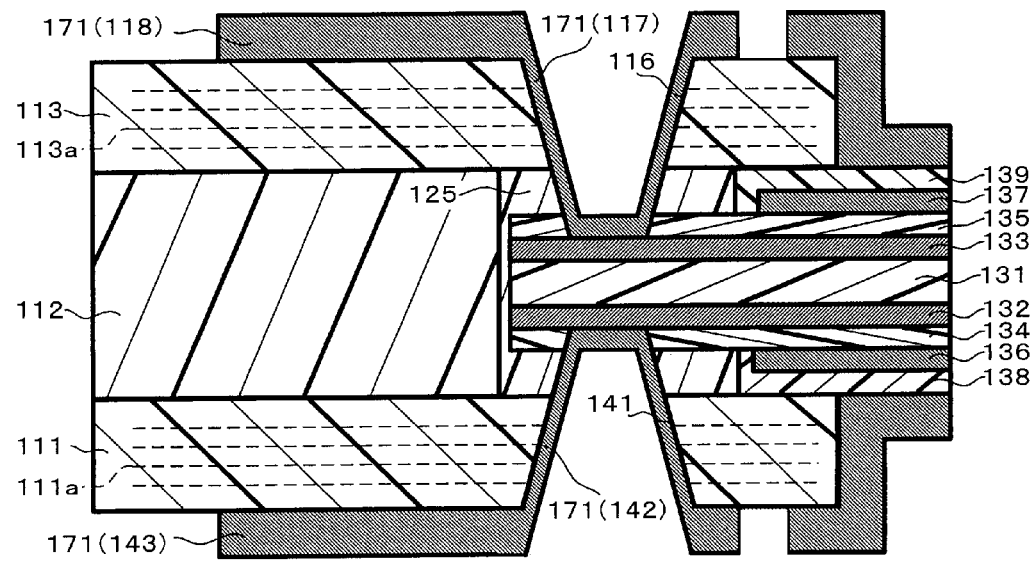
Figure 11E:
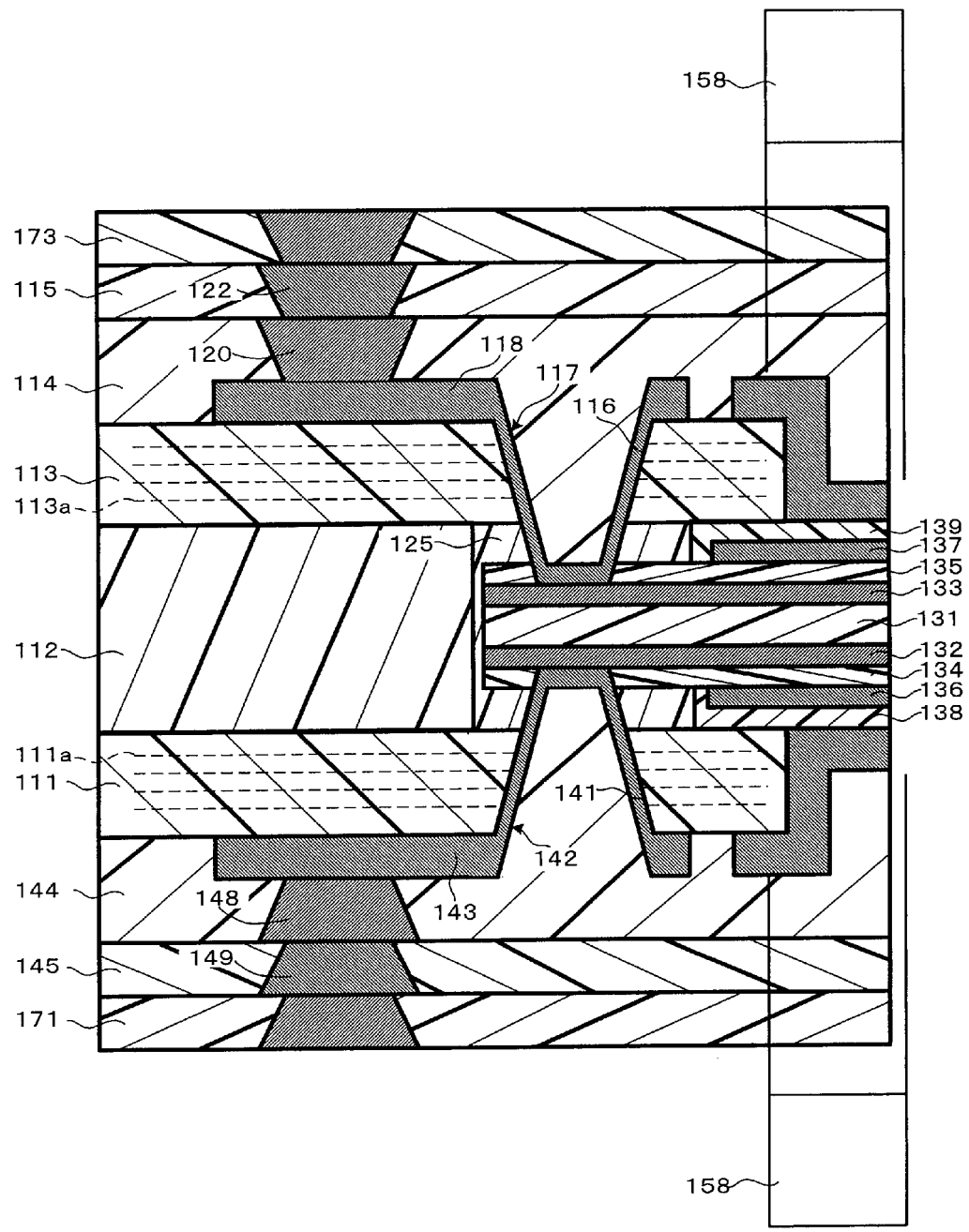
Figure 11F:
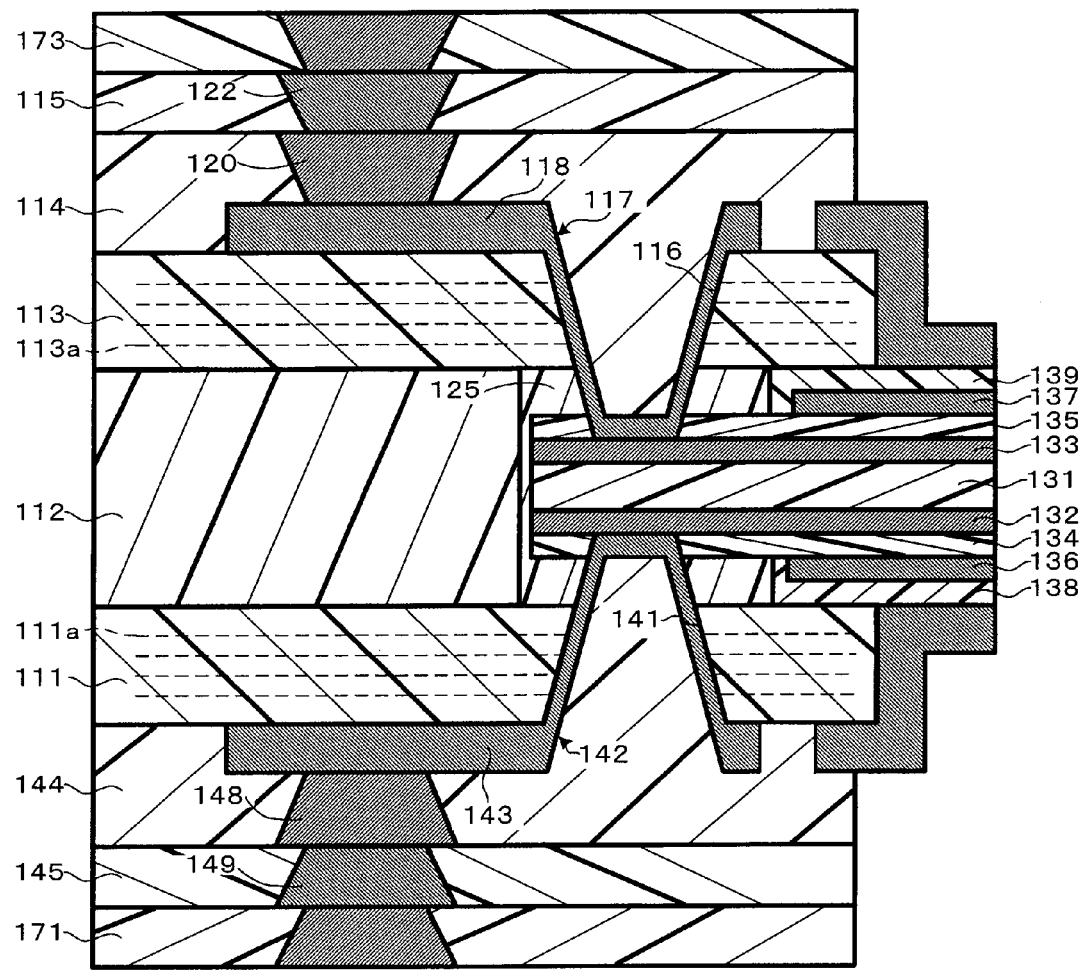
Figure 12A:
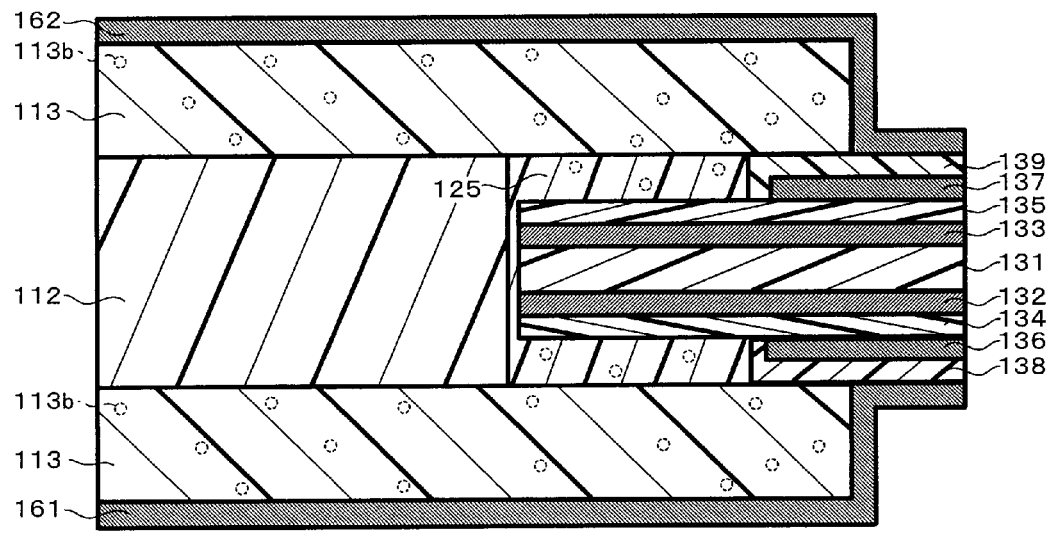
FIGS. 12A to 12F are views illustrating steps of a manufacturing method of the flex-rigid wiring board shown in FIG. 10B.
Figure 12B:
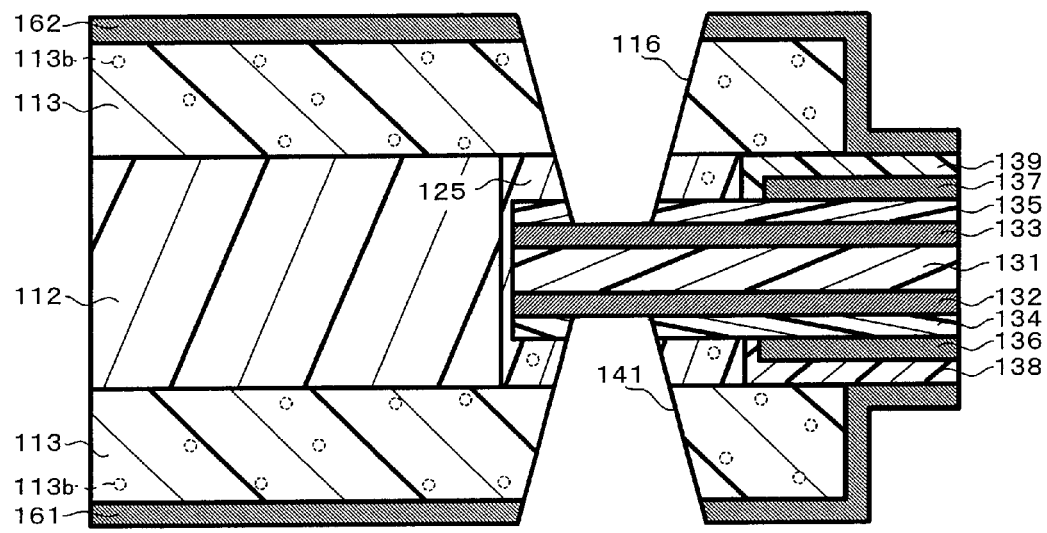
Figure 12C:
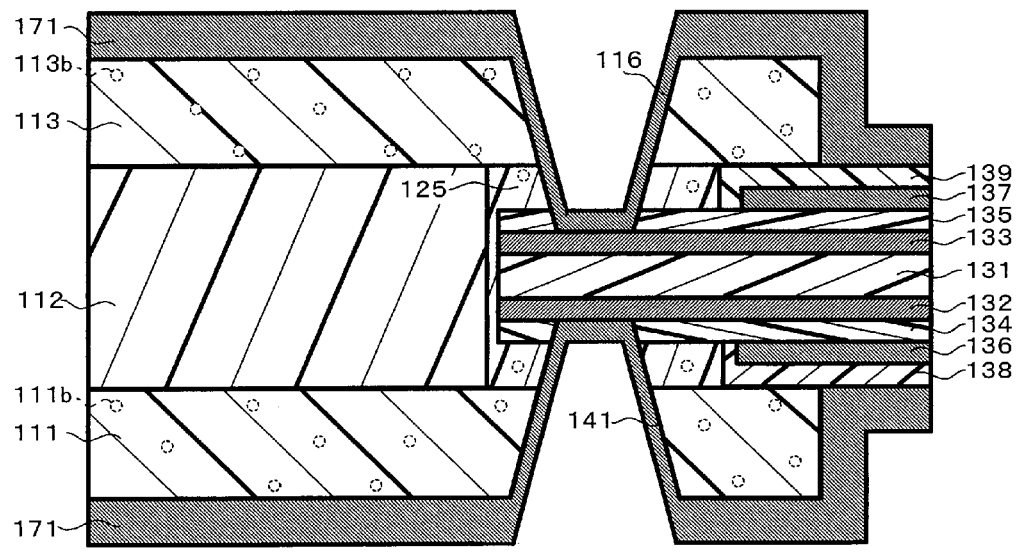
Figure 12D:
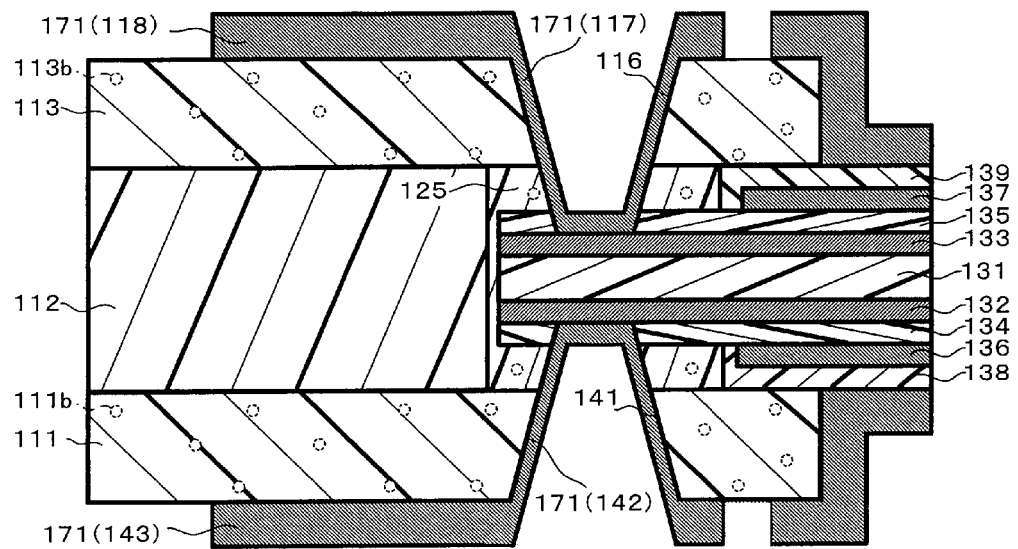
Figure 12E:
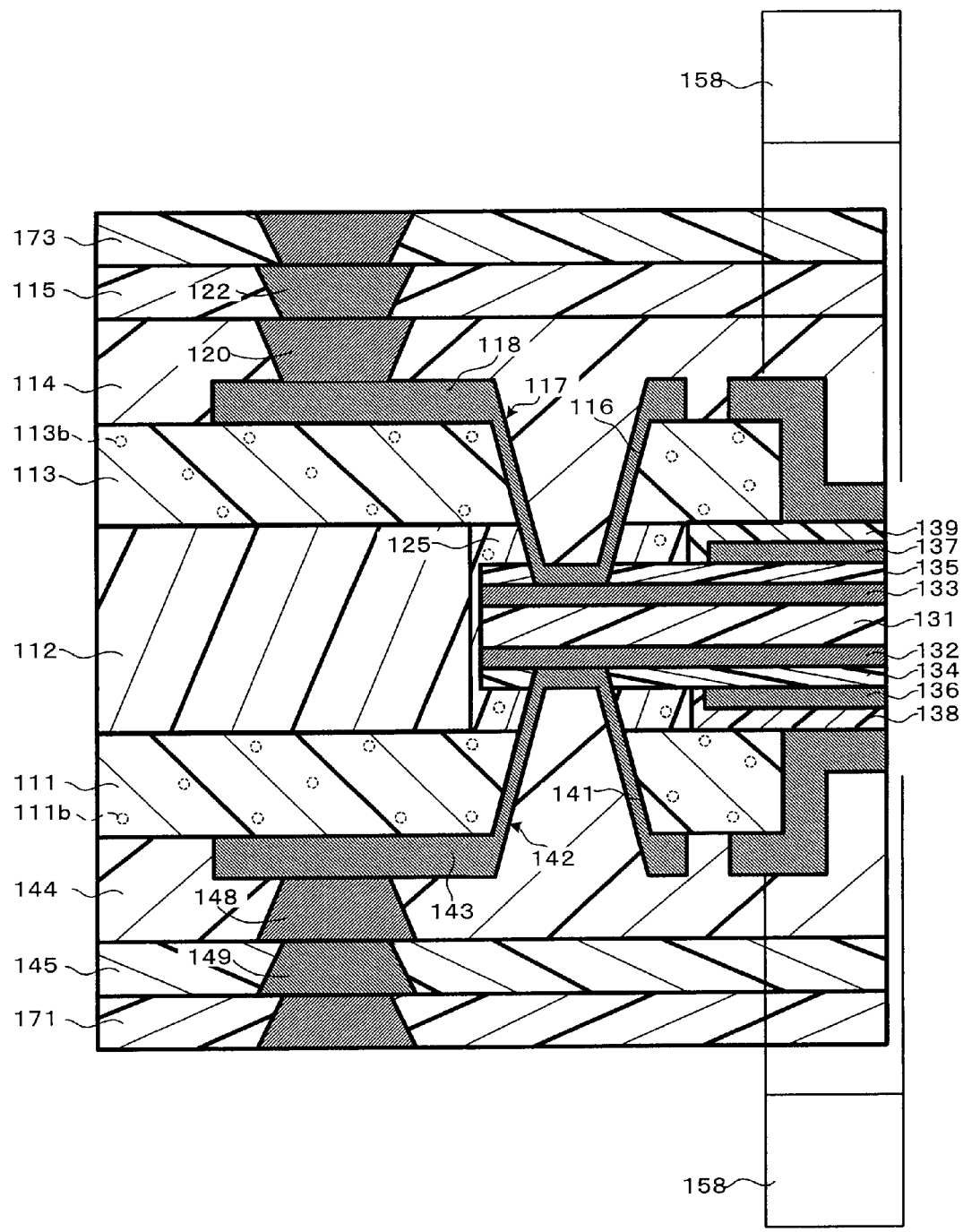
Figure 12F:
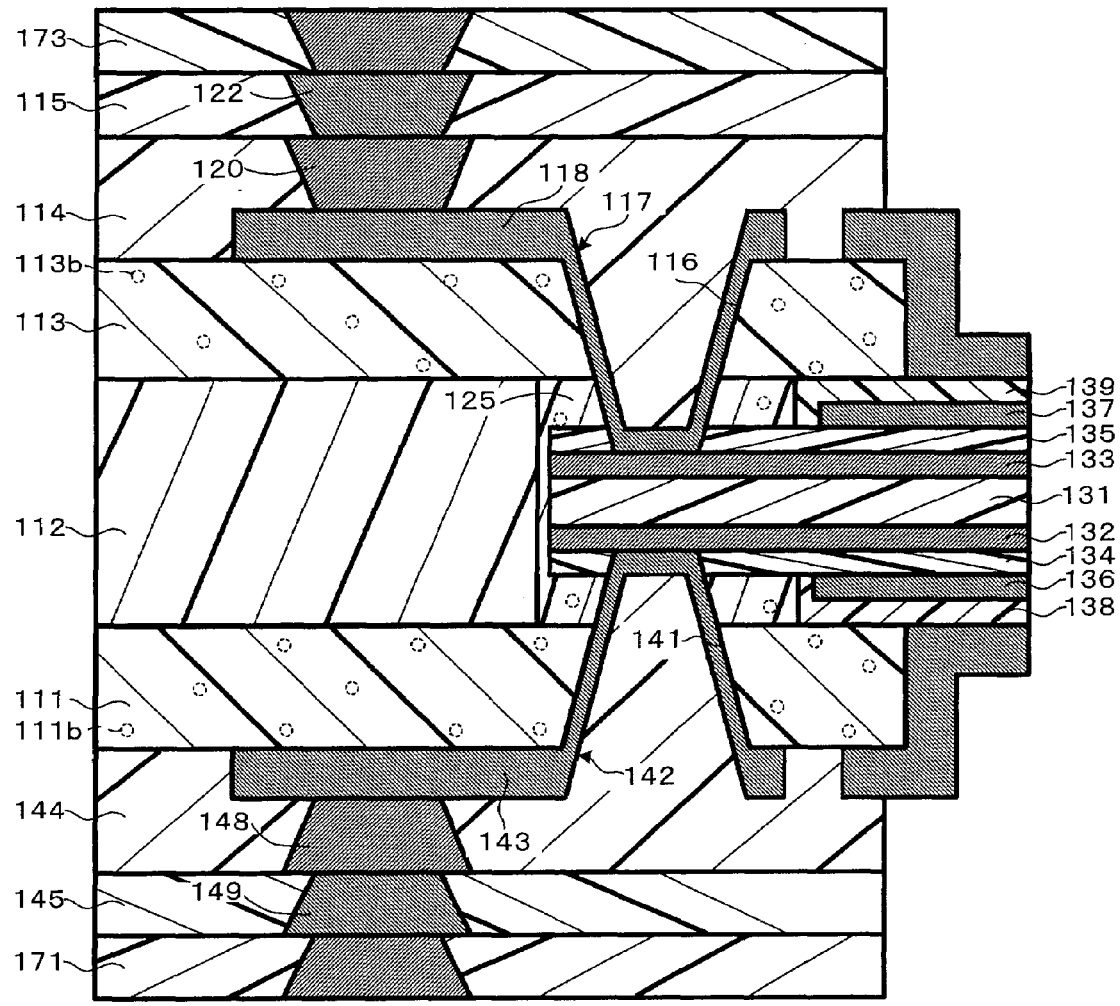

In addition, the flex-rigid wiring board 10 having the structure shown in FIG. 10B is manufactured, for example, by the steps shown in FIGS. 5A to 5L and FIGS. 12A to 12F. This manufacturing method is similar to that described with reference to FIGS. 5A to 5L and FIGS. 6A to 6F except that as the first and second insulating layers 111, 113, insulating layers (prepregs) which contain no glass clothes (111a, 113a) but contain the inorganic materials (111b, 113b) are used.

Figure 13A:
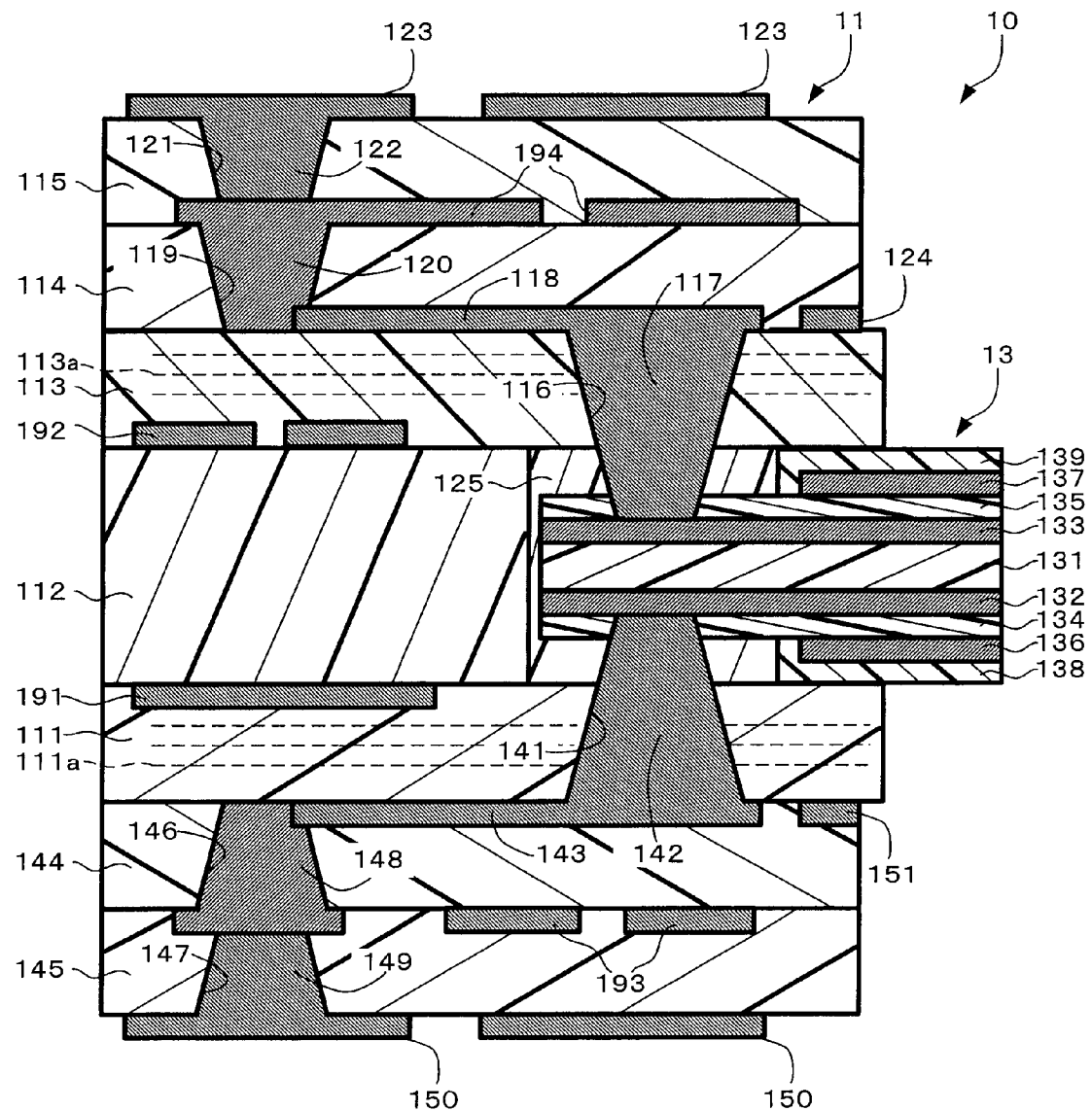
FIGS. 13A and 13B are view each showing a modification of the flex-rigid wiring board shown in FIG. 7.
Figure 13B:
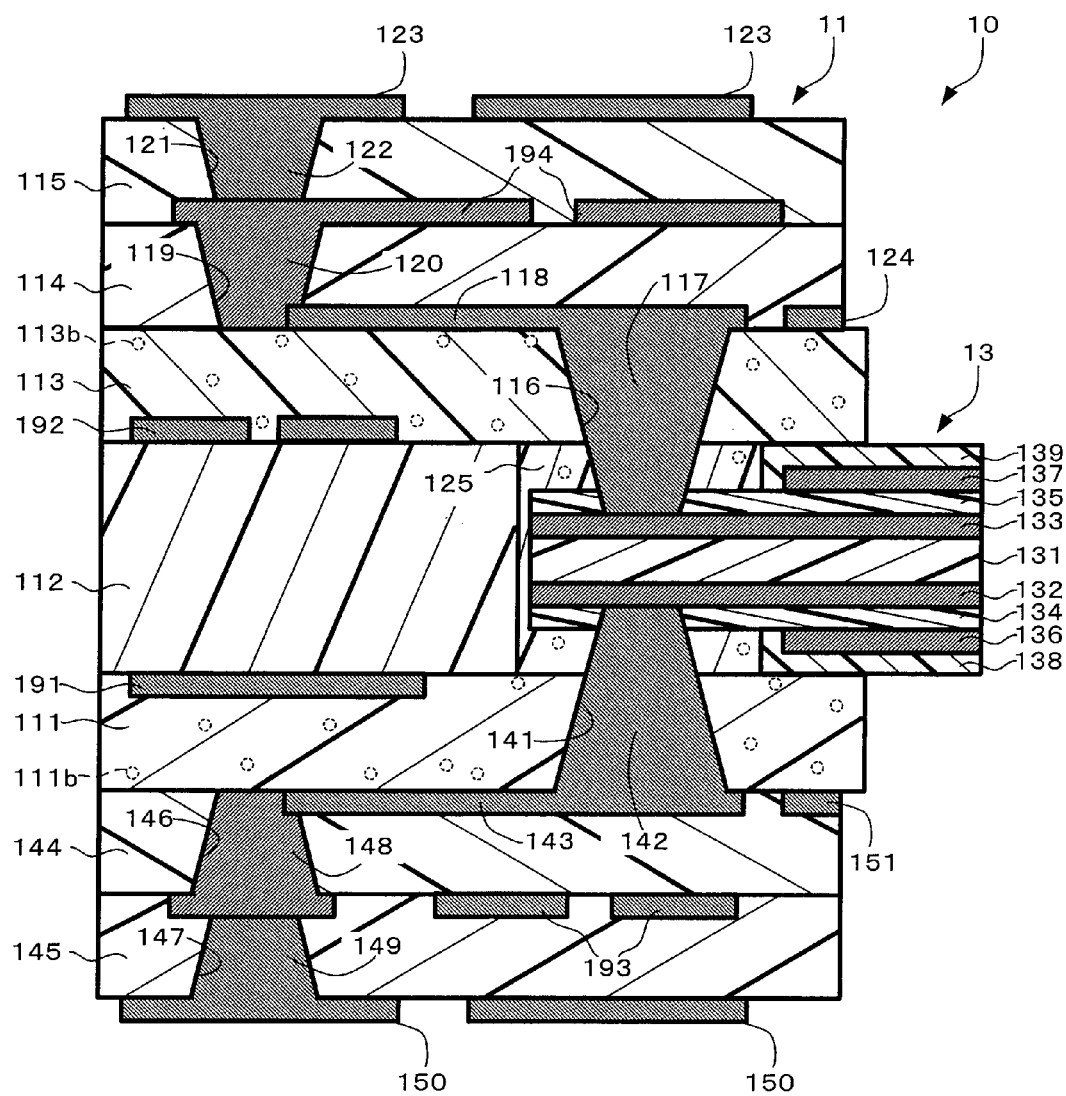

Furthermore, the flex-rigid wiring board 10 shown in FIG. 7 may be formed, for example, of the first and second insulating layers 111, 113 which contain the glass clothes (111a, 113a) but contain no inorganic materials (111b, 113b). In addition, as shown in FIG. 13B, the first and second insulating layers 111, 113 may contain the inorganic materials (111b, 113b), respectively, but may not contain the glass clothes (111a, 113a).

Figure 14A:
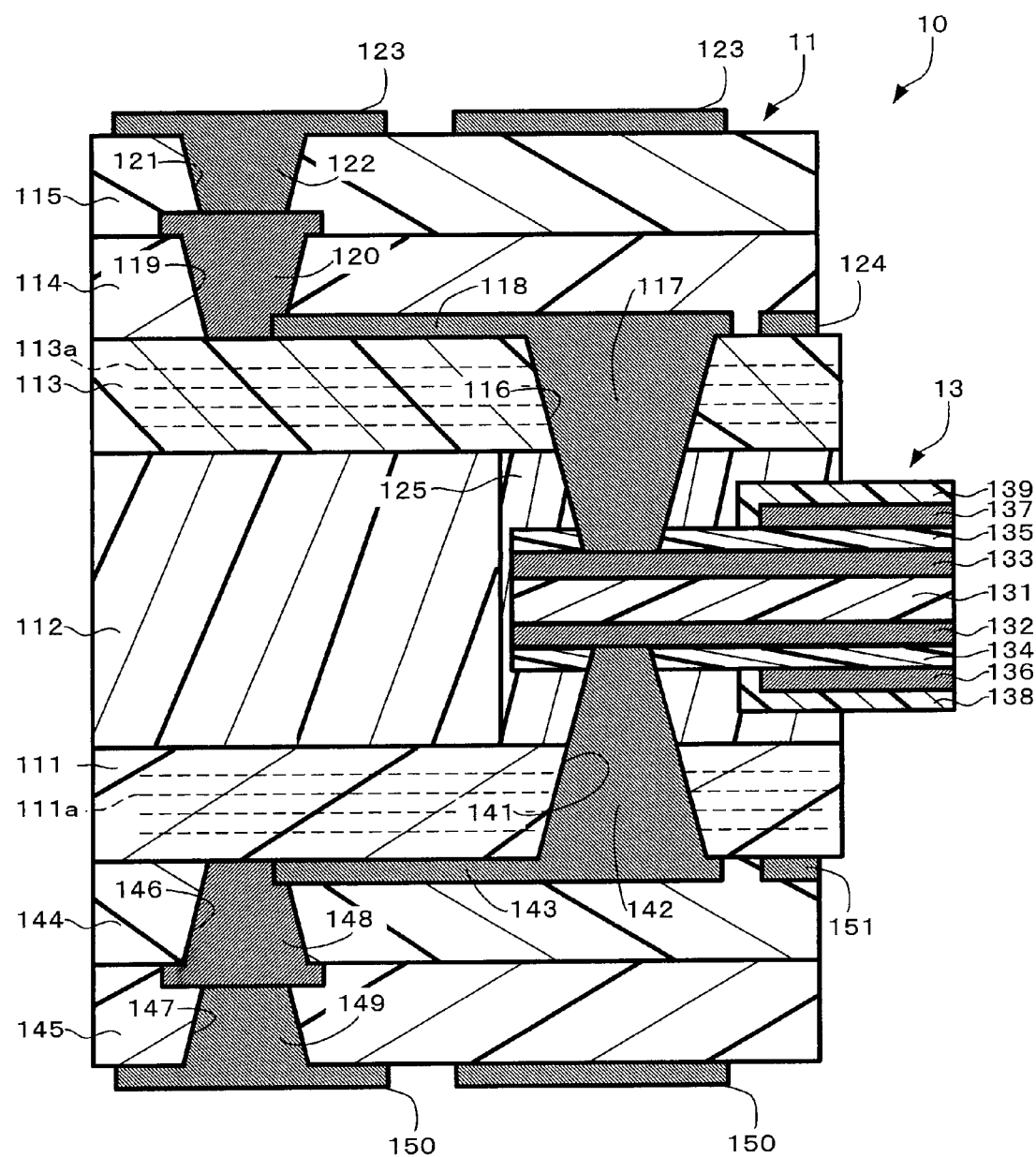
FIGS. 14A and 14B are views each showing a modification of the flex-rigid wiring board shown in FIG. 8.
Figure 14B:
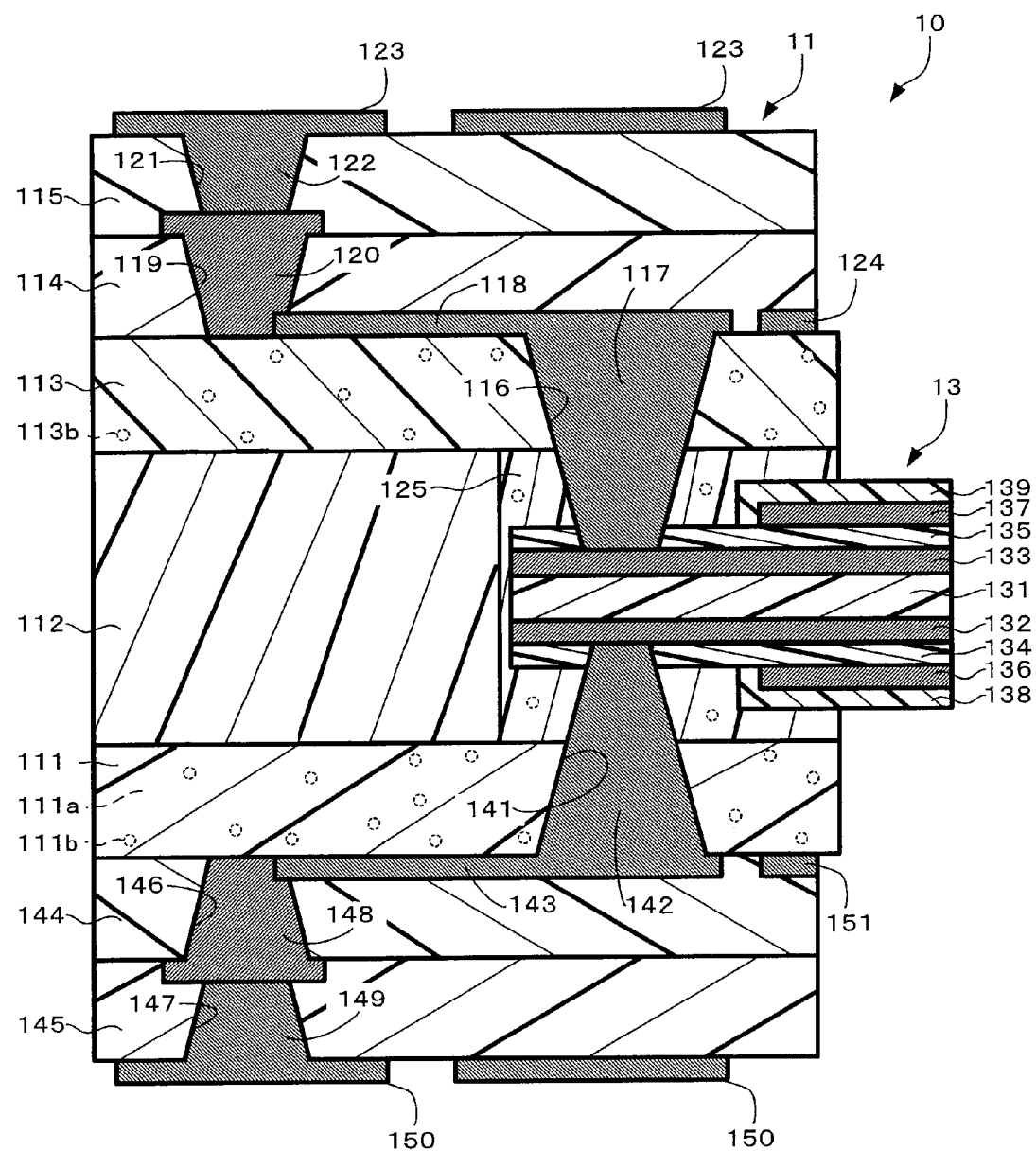
Figure 15:
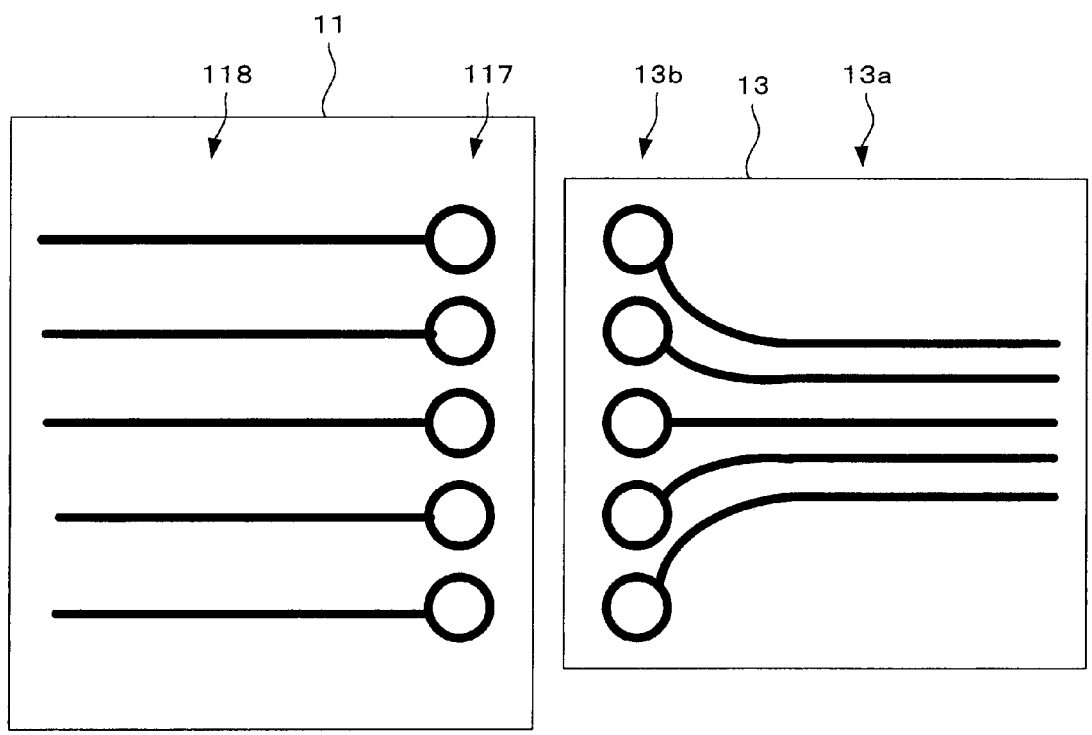
FIG. 15 is a view showing an example in which a wiring pattern is fanned out.
Figure 16:
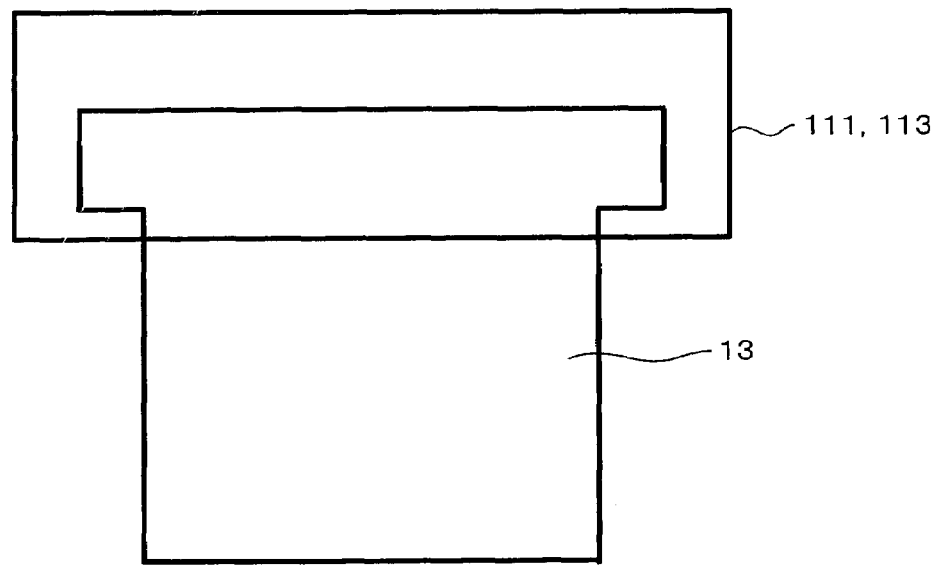
FIG. 16 is a view showing an example in which the strength is increased by forming a part of a flexible substrate to have a large width.

Furthermore, the flex-rigid wiring board 10 shown in FIG. 8 may be formed, for example, of the first and second insulating layers 111, 113 which contain the glass clothes (111a, 113a) but contain no inorganic materials (111b, 113b), as shown in FIG. 14A. In addition, as shown in FIG. 14B, the first and second insulating layers 111, 113 may contain the inorganic materials (111b, 113b), respectively, but may not contain the glass clothes (111a, 113a).

In the embodiments described above, as the inorganic materials contained in the insulating layers 111, 113, the glass clothes (111a, 113a), and silica filler or the glass filler (111b, 113b) are described by way of example. The insulating layers 111, 113 may contain an inorganic material other than those described above. For example, the insulating layers 111, 113 may contain silica particles, glass particles, carbon fibers, ceramic fibers, and the like.

Furthermore, the upper insulating layers 114, 115, 144, 145 also preferably contain inorganic materials such as glass clothes, silica filler, glass filler, and the like.

Figure 17:
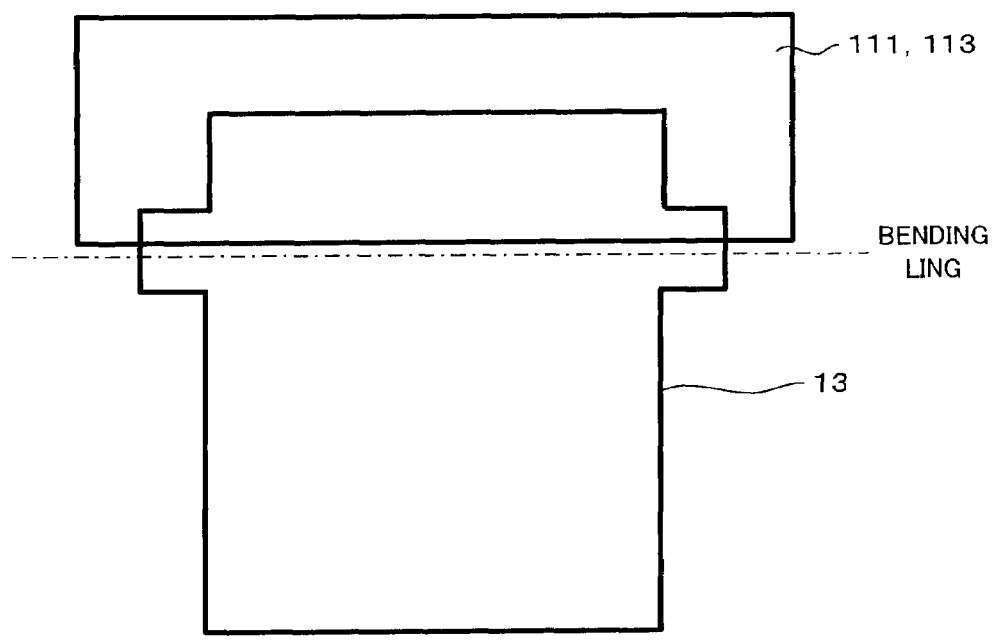
FIG. 17 is a view showing another example in which the strength is increased by forming a part of a flexible substrate to have a large width.

In addition, the wire patterns formed on the rigid boards 11, 12 and the flexible board 13 are not limited to those shown in FIG. 1, and as shown in FIG. 17, for example, a wire pattern may be formed so as to be fanned out from the flexible board 13 toward the rigid boards 11, 13. That is, the pitch of the connection portion (13b) may be set larger than the pitch of the wire (13a) of the flexible board 13. Accordingly, a larger number of wires may be disposed on the flexible board 13, and as a result, a flex-rigid wiring board having a high wire density can be formed.

In addition, in order to increase the strength of boundary portions between the flexible board 13 and the rigid boards 11, 12, as shown in FIGS. 18 and 19, for example, the flexible board 13 may be formed to have a partly larger width. Accordingly, the bonding areas of the flexible board 13 and the rigid boards 11, 12 are increased, and as a result, the connection reliability of the vias is improved.

For example, in the example shown in FIG. 18, the end portion of the flexible board 13 is enlarged, so that the areas of parts to be fixed to the rigid boards 11, 12 are increased. Accordingly, the strength of the end portions of the flexible board 13 is increased, and hence the bending resistance is improved.

In addition, in the example shown in FIG. 19, protrusions are formed at positions in which the flexible board 13 is bent repeatedly (for example, positions which correspond to the end portions of the rigid boards 11, 12), so that the strength at the positions in which bending is repeatedly performed is increased.

Obviously, numerous modifications and variations of the present invention are possible in light of the above teachings. It is therefore to be understood that within the scope of the appended claims, the invention may be practiced otherwise than as specifically described herein.

What is claimed is:

1. A method of manufacturing a flex-rigid wiring board comprising:
   disposing a flexible board comprising a flexible substrate and a conductor pattern formed over the flexible substrate and a non-flexible substrate adjacent to each other;
   covering a boundary between the flexible board and the non-flexible substrate with an insulating layer comprising an inorganic material;
   providing a conductor pattern on the insulating layer;
   forming a via hole opening which passes through the insulating layer and reaches the conductor pattern of the flexible board; and
   plating the via hole opening to form a via connecting the conductor pattern of the flexible board and the conductor pattern on the insulating layer.

2. The method for manufacturing a flex-rigid wiring board according to claim 1, wherein the insulating layer is formed of a resin containing the inorganic material, the resin containing the inorganic material, forms the insulating layer and is filled in a space formed among the non-flexible substrate, the flexible substrate, and the insulating layer, and the resin filled in the space is integrally cured with the insulating layer.

3. The method for manufacturing a flex-rigid wiring board according to claim 1, wherein the via hole opening is filled with a plating metal by the plating.

4. The method for manufacturing a flex-rigid wiring board according to claim 1, further comprising the boundary between the flexible board and the non-flexible substrate with another insulating layer comprising an inorganic material from an opposite surface side of the flexible board and the non-flexible substrate such that the boundary between the flexible board and the non-flexible substrate is covered with the insulating layers from a front surface side of the flexible board and the non-flexible substrate and a rear surface side of the flexible board and the non-flexible substrate.

5. The method for manufacturing a flex-rigid wiring board according to claim 1, further comprising:
  disposing a metal foil on the insulating layer and the flexible substrate;
  disposing a second insulating layer comprising an inorganic material on the metal foil; and
  cutting the second insulating layer at a position corresponding to end portions of the insulating layer by laser using the metal foil as a stopper.

6. The method for manufacturing a flex-rigid wiring board according to claim 1, further comprising:
  disposing a metal foil on the insulating layer and the flexible substrate;
  disposing a second insulating layer comprising an inorganic material on the metal foil;
  cutting the second insulating layer at a position corresponding to end portions of the insulating layer by laser using the metal foil as a stopper; and
  removing a remaining portion of the second insulating layer on the flexible substrate after the cutting together with the metal foil.

7. The method for manufacturing a flex-rigid wiring board, according to claim 1, further comprising:
  disposing a metal foil on the insulating layer and the flexible substrate;
  forming a circuit pattern above the insulating layer by patterning the metal foil;
  disposing a second insulating layer comprising an inorganic material on the metal foil; and
  cutting the second insulating layer at a position corresponding to end portions of the insulating layer by laser using the metal foil as a stopper.

8. The method for manufacturing a flex-rigid wiring board according to claim 1, further comprising:
  disposing a metal foil on the insulating layer and the flexible substrate;
  disposing a second insulating layer comprising an inorganic material on the metal foil;
  forming a conductive pattern on the second insulating layer; and
  cutting the second insulating layer at a position corresponding to end portions of the insulating layer by laser using the metal foil as a stopper.

9. The method for manufacturing a flex-rigid wiring board according to claim 1, disposing a second insulating layer comprising an inorganic material on the insulating layer, wherein the second insulating layer is composed of a resin containing the inorganic material, and the via hole opening is filled with the resin of the second insulating layer after the plating.

10. The method for manufacturing a flex-rigid wiring board according to claim 1, wherein the insulating layer is composed of a resin containing the inorganic material.

11. The method for manufacturing a flex-rigid wiring board according to claim 1, further comprising:
  covering the boundary between the flexible board and the non-flexible substrate with another insulating layer comprising an inorganic material from an opposite surface side of the flexible board and the non-flexible substrate such that the insulating layers cover the boundary between the flexible board and the non-flexible substrate from opposite sides of the flexible board and the non-flexible substrate; and
  forming a via hole opening which passes through the insulating layer on the opposite surface side of the flexible board and the non-flexible substrate such that the via hole openings sandwich the flexible board.

12. The method for manufacturing a flex-rigid wiring board according to claim 11, further comprising plating the via hole opening on the opposite surface side of the flexible board and the non-flexible substrate.

13. The method for manufacturing a flex-rigid wiring board according to claim 12, wherein the via hole openings are filled with a plating metal by the plating.

14. The method for manufacturing a flex-rigid wiring board according to claim 11, disposing a plurality of second insulating layers each comprising an inorganic material on the insulating layers, respectively, wherein each of the second insulating layers is composed of a resin containing the inorganic material, and each of the via hole openings is filled with the resin of a respective one of the second insulating layers after the plating.

15. The method for manufacturing a flex-rigid wiring board according to claim 11, further comprising:
  disposing a plurality of metal foils on the insulating layers and the flexible substrate, respectively;
  disposing a plurality of second insulating layers each comprising an inorganic material on the metal foils, respectively; and
  cutting the second insulating layers at positions corresponding to end portions of the insulating layers by laser using the metal foils as stoppers.

16. The method for manufacturing a flex-rigid wiring board according to claim 11, further comprising:
  disposing a plurality of metal foils on the insulating layers and the flexible substrate, respectively;
  disposing a plurality of second insulating layers each comprising an inorganic material on the metal foils, respectively;
  cutting the second insulating layers at positions corresponding to end portions of the insulating layers by laser using the metal foils as stoppers; and
  removing remaining portions of the second insulating layers on the flexible substrate after the cutting together with the metal foils.

17. The method for manufacturing a flex-rigid wiring board according to claim 11, further comprising:
  disposing a plurality of metal foils on the insulating layers and the flexible substrate, respectively;
  forming a plurality of circuit patterns above the insulating layers by patterning the metal foils;
  disposing a plurality of second insulating layers each comprising an inorganic material on the metal foils, respectively; and cutting the second insulating layers at positions corresponding to end portions of the insulating layers by laser using the metal foils as stoppers.

18. The method for manufacturing a flex-rigid wiring board according to claim 11, further comprising:
disposing a plurality of metal foils on the insulating layers and the flexible substrate, respectively;
disposing a plurality of second insulating layers each comprising an inorganic material on the metal foils, respectively;
forming a plurality of conductive patterns on the second insulating layers, respectively; and
cutting the second insulating layers at positions corresponding to end portions of the insulating layers by laser using the metal foils as stoppers.

19. The method for manufacturing a flex-rigid wiring board according to claim 11, wherein each of the insulating layers is composed of a resin containing the inorganic material.

20. The method for manufacturing a flex-rigid wiring board according to claim 11, wherein the insulating layers are formed of resins containing the inorganic materials, the resins form the insulating layers and are filled in spaces formed among the non-flexible substrate, the flexible substrate, and the insulating layers, and the resins filled in the spaces are integrally cured with the insulating layers.

\* \* \* \* \*